United States Patent
Koukitu et al.

(10) Patent No.: US 10,125,433 B2
(45) Date of Patent: Nov. 13, 2018

(54) NITRIDE SEMICONDUCTOR CRYSTAL, MANUFACTURING METHOD AND MANUFACTURING EQUIPMENT

(71) Applicant: National University Corporation Tokyo University of Agriculture and Technology, Tokyo (JP)

(72) Inventors: Akinori Koukitu, Fuchu (JP); Yoshinao Kumagai, Fuchu (JP); Hisashi Murakami, Fuchu (JP)

(73) Assignees: National University Corporation Tokyo, Tokyo (JP); University of Agriculture and Technology, Tokyo (JP)

( * ) Notice: Subject to any disclaimer, the term of this patent is extended or adjusted under 35 U.S.C. 154(b) by 115 days.

(21) Appl. No.: 15/064,553

(22) Filed: Mar. 8, 2016

(65) Prior Publication Data

US 2016/0186361 A1    Jun. 30, 2016

Related U.S. Application Data

(63) Continuation of application No. PCT/JP2014/004655, filed on Sep. 10, 2014.

(30) Foreign Application Priority Data

Sep. 11, 2013    (JP) ................. 2013-188805

(51) Int. Cl.
    *C30B 25/14*    (2006.01)
    *C30B 25/08*    (2006.01)
    (Continued)

(52) U.S. Cl.
    CPC .............. *C30B 25/14* (2013.01); *C30B 25/00* (2013.01); *C30B 25/02* (2013.01); *C30B 25/08* (2013.01);
    (Continued)

(58) Field of Classification Search
    None
    See application file for complete search history.

(56) References Cited

U.S. PATENT DOCUMENTS

| 4,144,116 A | 3/1979 | Jacob et al. |
| 4,956,159 A | 9/1990 | Shibasaki et al. |
| (Continued) | | |

FOREIGN PATENT DOCUMENTS

| JP | H11-354844 A | 12/1999 |
| JP | 2006-14351 A | 1/2006 |
| (Continued) | | |

OTHER PUBLICATIONS

Office Action issued for counterpart Japanese Application 2015-536448, issued by the Japan Patent Office dated May 9, 2017.
(Continued)

*Primary Examiner* — Guinever S Gregorio

(57) ABSTRACT

A nitride semiconductor crystal has a diameter of four inches or more and is warped to have a curvature radius of 100 m or more, and has an impurity concentration of $1 \times 10^{17}/cm^3$ or lower. A manufacturing method for a nitride semiconductor crystal includes providing a substrate, feeding a gallium trihalide gas having a partial pressure of $9.0 \times 10^{-3}$ atm or higher onto the substrate, and growing a GaN crystal in the −C-axis direction on the substrate, where a growth temperature for the GaN crystal is 1200° C. or higher, or a manufacturing method for a nitride semiconductor crystal includes providing a substrate, feeding an aluminum trihalide gas having a partial pressure of $9.0 \times 10^{-3}$ atm or higher onto the substrate, and growing an AlN crystal in the −C-axis direction on the substrate, where a growth temperature for the AlN crystal is 1400° C. or higher.

10 Claims, 26 Drawing Sheets

(51) Int. Cl.
   *C30B 29/40* (2006.01)
   *C30B 25/00* (2006.01)
   *C30B 25/02* (2006.01)
   *C30B 25/10* (2006.01)
   *C30B 25/16* (2006.01)
   *C30B 25/18* (2006.01)
   *C30B 25/20* (2006.01)
   *H01L 21/02* (2006.01)

(52) U.S. Cl.
   CPC ............ *C30B 25/10* (2013.01); *C30B 25/165* (2013.01); *C30B 25/18* (2013.01); *C30B 25/20* (2013.01); *C30B 29/403* (2013.01); *C30B 29/406* (2013.01); *H01L 21/0254* (2013.01); *H01L 21/0262* (2013.01); *H01L 21/02389* (2013.01); *H01L 21/02433* (2013.01); *H01L 21/02458* (2013.01); *H01L 21/02609* (2013.01)

(56) References Cited

U.S. PATENT DOCUMENTS

| | | | |
|---|---|---|---|
| 6,270,587 | B1 | 8/2001 | Motoki et al. |
| 8,926,752 | B2 * | 1/2015 | Koukitu |
| 2008/0296585 | A1 | 12/2008 | Matsumoto et al. |
| 2009/0056631 | A1 | 3/2009 | Lai |
| 2009/0149008 | A1 | 6/2009 | Kryliouk et al. |
| 2010/0093124 | A1 * | 4/2010 | Koukitu |
| 2011/0033966 | A1 | 2/2011 | Su et al. |
| 2011/0155049 | A1 | 6/2011 | Solomon et al. |
| 2013/0130477 | A1 * | 5/2013 | Kumagai |

FOREIGN PATENT DOCUMENTS

| | | |
|---|---|---|
| JP | 2006-96588 A | 4/2006 |
| JP | 2006-335607 A | 12/2006 |
| JP | 2010-265178 A | 11/2010 |
| JP | 2013-60340 A | 4/2013 |

OTHER PUBLICATIONS

Extended European Search Report for European Patent Application No. 14 843 243.8, issued by the European Patent Office dated Jun. 14, 2017.

International Search Report for International Application No. PCT/JP2014/004655, issued by the Japan Patent Office dated Oct. 7, 2014.

Varadarajan et al. ; "Growth of GaN films by chloride vapour phase epitaxy"; Journal of Crystal Growth; 268: 475-477.

Lai, Ying-Huang "Sputtering and Etching of GaN Burble" J. Phys. Chem B 2001,105, 10029-10036.

Hanaoka et al. Thermodynamic analysis on HVPE growth of InGaN ternary alloy. Journal of Crystal Growth 318, 441-445.

Kikuchi et al. Thermodynamic Analysis of Various Types of Hydride Vapor Phase Epitaxy System for High-Speed Growth of InN. Japanese Journal of Applied Physics vol. 45, No. 45 L1203-1205.

Kumagai et al. Hydride vapor phase epitaxy of AlN: thermodynamic analysis of aluminum source and its application to growth. Physica status solidi (c) No. 7, 2498-2501.

Paskova et al. Hydride vapour-phase epitaxy growth and cathodoluminescence characterisation of thick GaN film. Journal of Crystal Growth vol. 203, 1-11.

* cited by examiner

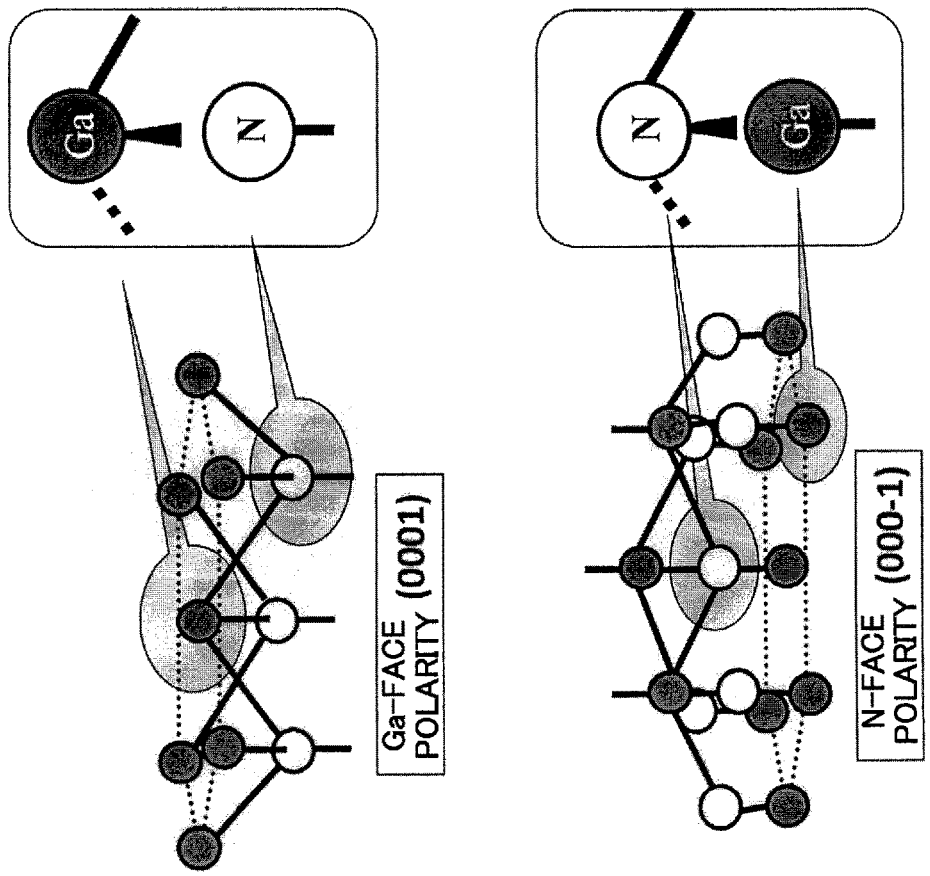
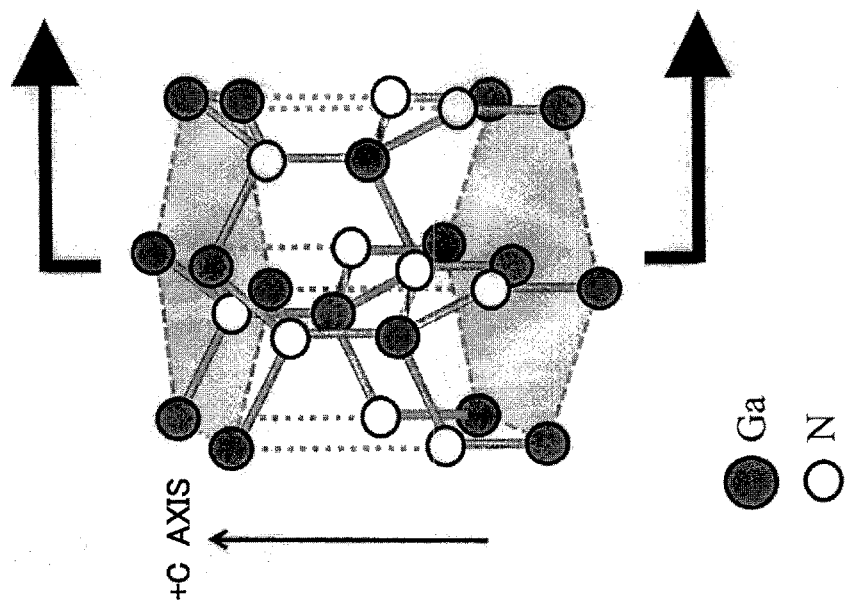
FIG. 4

| | (i) | (ii) | (iii) | (iv) | (v) |
|---|---|---|---|---|---|
| -C-AXIS GROWTH | DIAMETER: 4 INCHES DISLOCATION DENSITY: ≤1×10⁵/cm² CURVATURE RADIUS: ≥100m | | THICKNESS: ≥100 μM | IMPURITY CONCENTRATION: ≤1×10¹⁷/cm³ | DIAMETER: 3 INCHES THICKNESS: ≥5mm |

| GROWTH TECHNIQUE/CONDITIONS | | (i) | (i)+(ii) | (i)+(ii)+(iii) | (i)+(ii)+(iii)+(iv) | (i)+(v) |
|---|---|---|---|---|---|---|
| THVPE (PRESENT INVENTION) | GROWTH TEMPERATURE: ≥1300°C GaCl₃ PARTIAL PRESSURE: ≥9.0×10⁻³ atm | ○ | ○ | ○ | ○ | ○ |
| THVPE (PRESENT INVENTION) | GROWTH TEMPERATURE: ≥1200°C AND <1300°C GaCl₃ PARTIAL PRESSURE: ≥9.0×10⁻³ atm | ○ | ○ | ○ | × | ○ |
| THVPE (CONVENTIONAL ART) | GROWTH TEMPERATURE: ≥1200°C AND <1300°C GaCl₃ PARTIAL PRESSURE: ≤8.0×10⁻³ atm | ○ | ○ | ○ | × | × |
| HVPE | | × | × | × | × | × |
| MOVPE | | △ | △ | × | × | × |
| MBE | | ○ | ○ | × | × | × |

FIG. 7

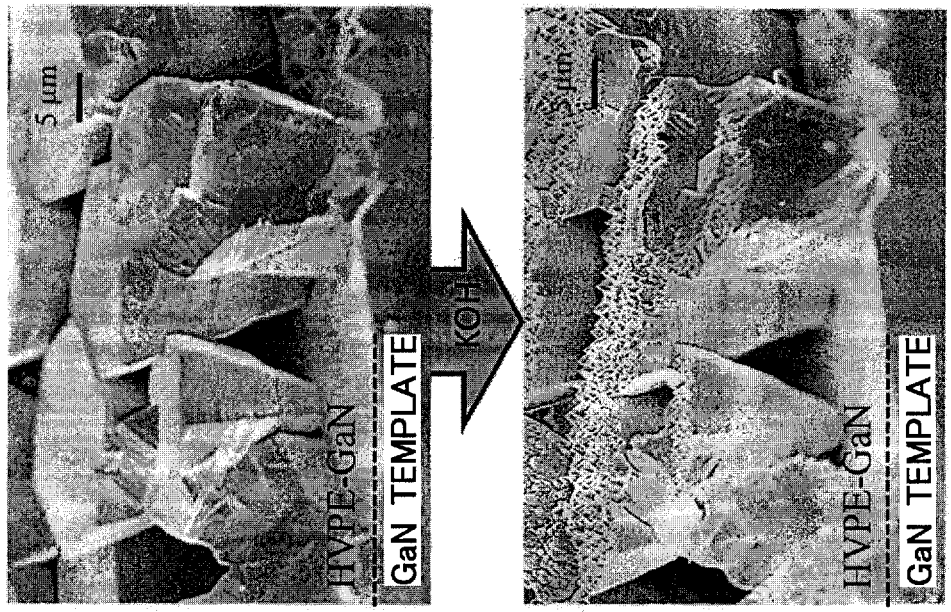
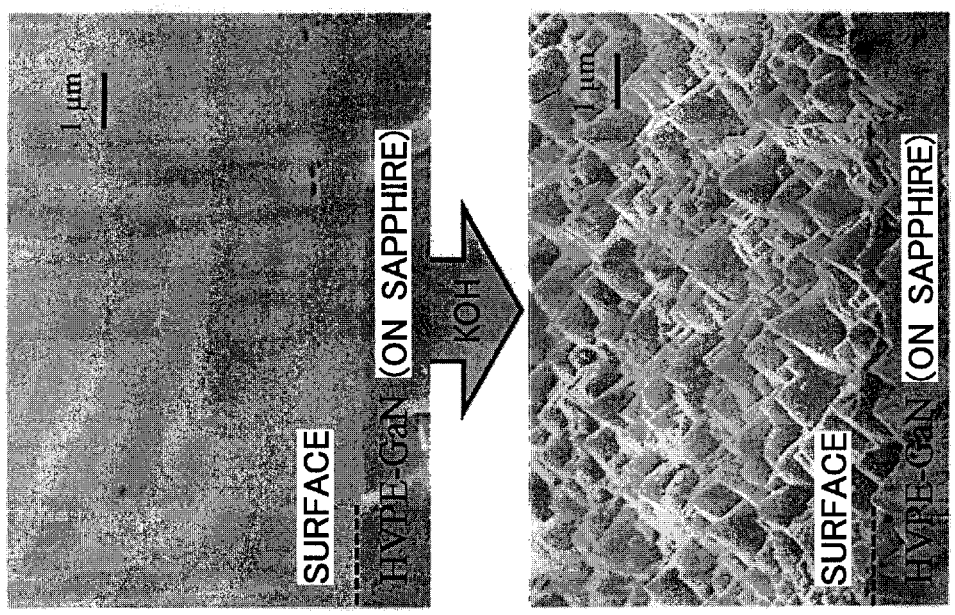
FIG. 14

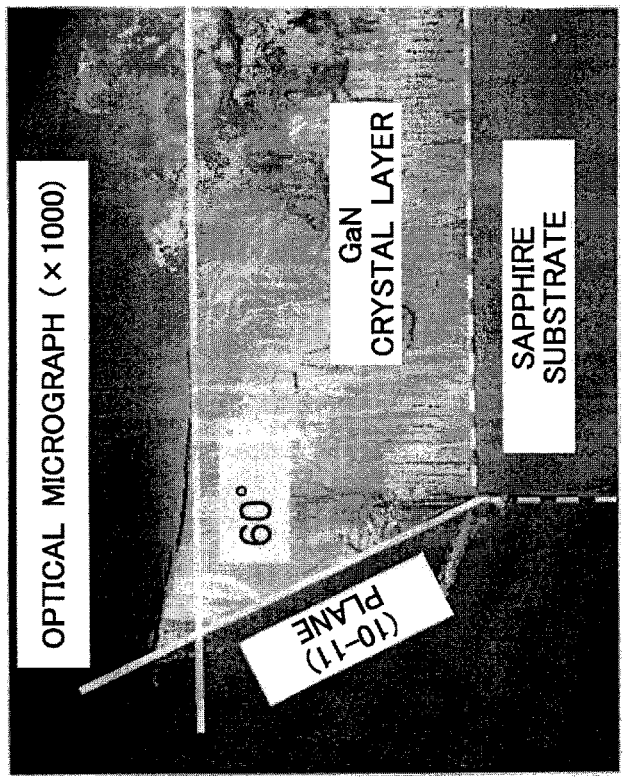
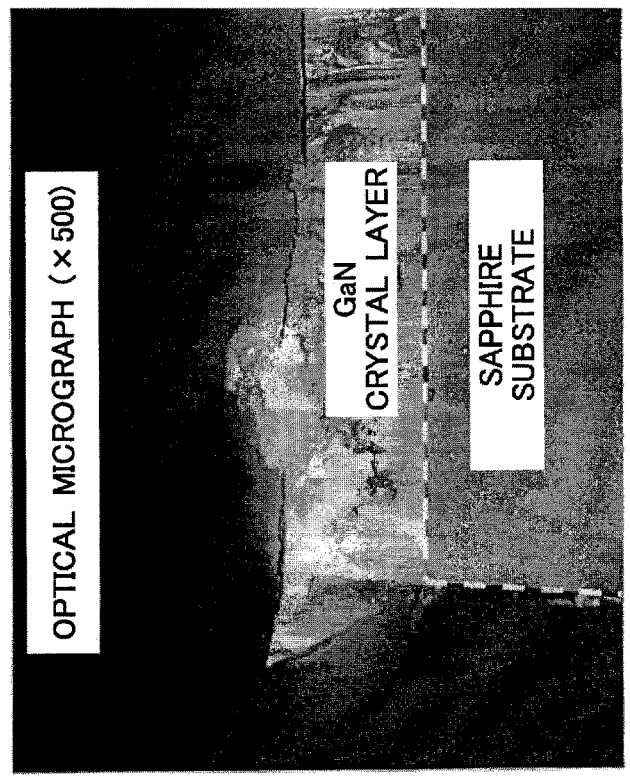
FIG. 19

NITRIDE SEMICONDUCTOR CRYSTAL, MANUFACTURING METHOD AND MANUFACTURING EQUIPMENT

The contents of the following Japanese and International patent application(s) are incorporated herein by reference:
2013-188805 filed in JP on Sep. 11, 2013; and
PCT/JP2014/004655 filed on Sep. 10, 2014

BACKGROUND

1. Technical Field

The present invention relates to a nitride semiconductor crystal, a manufacturing method and manufacturing equipment.

2. Related Art

In the conventional art, nitride semiconductor crystals have been used in various fields such as laser diodes (LDs), light emitting diodes (LEDs), solar cells, and power devices.

Tri-halide vapor phase epitaxy (THVPE) can grow nitride semiconductor crystals at higher temperatures and rates than hydride vapor phase epitaxy (HVPE).

However, the conventional THVPE technique does not allow source gases of high concentration to be used and thus cannot manufacture nitride semiconductor crystals having a large diameter and a very large thickness (see, for example, International Publication No. 2011/142402).

SUMMARY

A first aspect of the innovations may include a manufacturing method for a nitride semiconductor crystal, including providing a substrate, feeding a gallium trihalide gas having a partial pressure of $9.0 \times 10^{-3}$ atm or higher onto the substrate, and growing a GaN crystal in the –C-axis direction on the substrate. Here, a growth temperature for the GaN crystal is 1200° C. or higher.

A second aspect of the innovations may include a manufacturing method for a nitride semiconductor crystal, including providing a substrate, feeding an aluminum trihalide gas having a partial pressure of $9.0 \times 10^{-3}$ atm or higher onto the substrate, and growing an AlN crystal in the –C-axis direction on the substrate. Here, a growth temperature for the AlN crystal is 1400° C. or higher.

A third aspect of the innovations may include a nitride semiconductor crystal having a diameter of four inches or more and being warped to have a curvature radius of 100 m or more, and having an impurity concentration of $1 \times 10^{17}/\text{cm}^3$ or lower.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 shows the structure and polarity of a GaN crystal.

FIG. 7 is a table comparing the characteristics of nitride semiconductor crystals obtained by different growth techniques.

FIG. 14 shows how to determine the polarity of a GaN crystal using KOH etching.

FIG. 19 shows optical micrographs showing a GaN crystal layer relating to a fourth working example.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
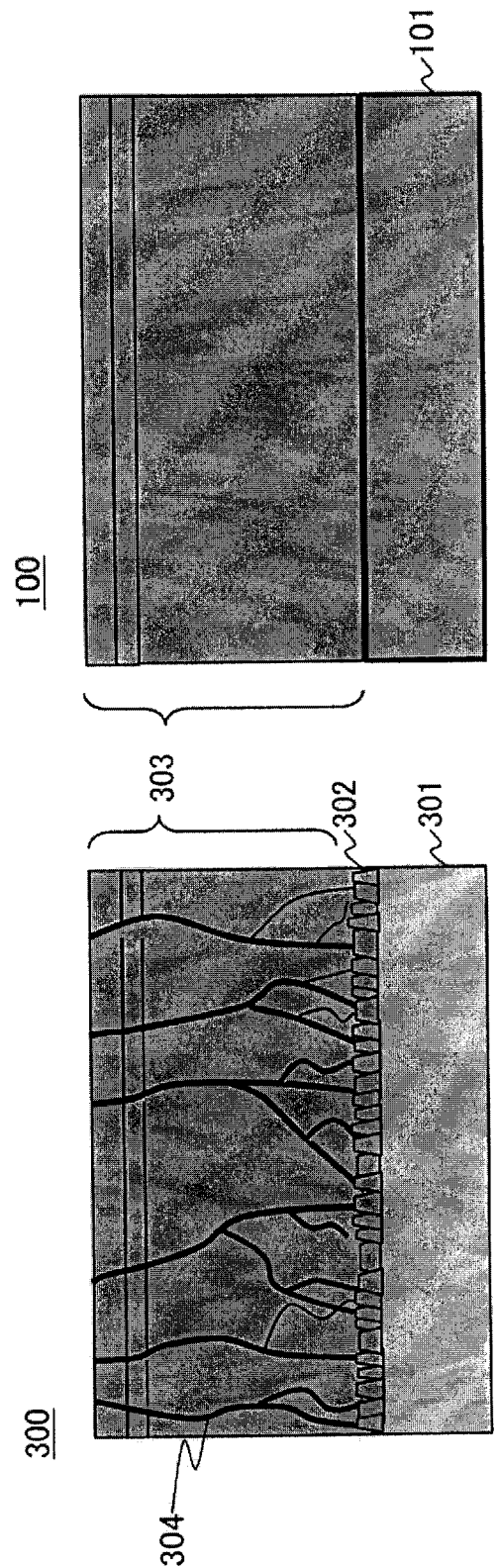
FIG. 1 schematically shows the cross-sections of laminates in which a nitride semiconductor thin film layer is stacked on an initial substrate.

FIG. 1 schematically shows the cross-sections of laminates in which a nitride semiconductor thin film layer is stacked on an initial substrate. FIG. 1 shows a laminate 300 (the left view) including a nitride semiconductor thin film layer 303 and an initial substrate 301 that are respectively made of different materials and a laminate 100 (the right view) including a nitride semiconductor thin film layer 303 and an initial substrate 101 that are both made of the same material.

In the conventional art, high-quality and large-diameter nitride semiconductor substrates (the initial substrate 101) are not available. Therefore, as the initial substrate on which the nitride semiconductor thin film layer 303 is to grow, the initial substrate 301, which is made of a different material, has been conventionally used. For example, sapphire substrates have been used for LEDs and silicon substrates have been used for horizontal electronic devices. When the initial substrate 301, which is made of a different material, is used, a low-temperature buffer layer 302 is provided on the initial substrate 301.

The low-temperature buffer layer 302 is used to reduce the differences in lattice constant and thermal expansion coefficient between the initial substrate 301 and the nitride semiconductor thin film layer 303. For example, the difference in lattice constant is reduced to some extent so that the crystalline nitride semiconductor thin film layer 303 is allowed to grow on the initial substrate 301, which is made of a different material.

The nitride semiconductor thin film layer 303 is epitaxially grown on the low-temperature buffer layer 302 using MOVPE and the like. Here, the use of the low-temperature buffer layer 302 cannot completely eliminate the effects of the difference in lattice constant. Thus, the difference in lattice constant still causes many defects 304 to be generated in the nitride semiconductor thin film layer 303. For example, on the surface of the nitride semiconductor thin film layer 303, the dislocation density is as high as approximately $10^9$ cm$^{-2}$ or more. In addition, when the nitride semiconductor thin film layer 303 is grown at high temperatures, the difference in thermal expansion coefficient causes stress strain (warpage) as the temperature drops to ordinary temperatures.

For example, when a nitride semiconductor crystal layer has stress-induced warpage having a curvature radius of 100 m or more, such a crystal layer can be put into practical use as a reliable undistorted nitride semiconductor crystal. The current market offers four-inch GaN crystal layers manufactured using the initial substrate 301, which is made of a different material, but they have a curvature radius of approximately 20 m. The Ammonothermal method, which does not use the initial substrate 301 that is made of a different material, can be used to manufacture crystal layers that are warped with a curvature radius of 1000 m, but is not suitable for manufacturing crystal layers of a large diameter and can only grow crystal layers of approximately two inches at the largest.

On the other hand, when the initial substrate 101, which is made of a nitride semiconductor crystal, is used, the nitride semiconductor thin film layer 303 can be homoepitaxially grown and the dislocation density can be accordingly significantly lowered. In one example, when the initial substrate 101 is made of a nitride semiconductor crystal, a lowered dislocation density of $1\times10^5$ cm$^{-2}$ or lower can be achieved, and nitride semiconductor crystals having a diameter of four inches and a curvature radius of 300 m or more can be obtained. In addition, even nitride semiconductor crystals having a curvature radius of 1000 m or more can be also obtained.

Figure 2:
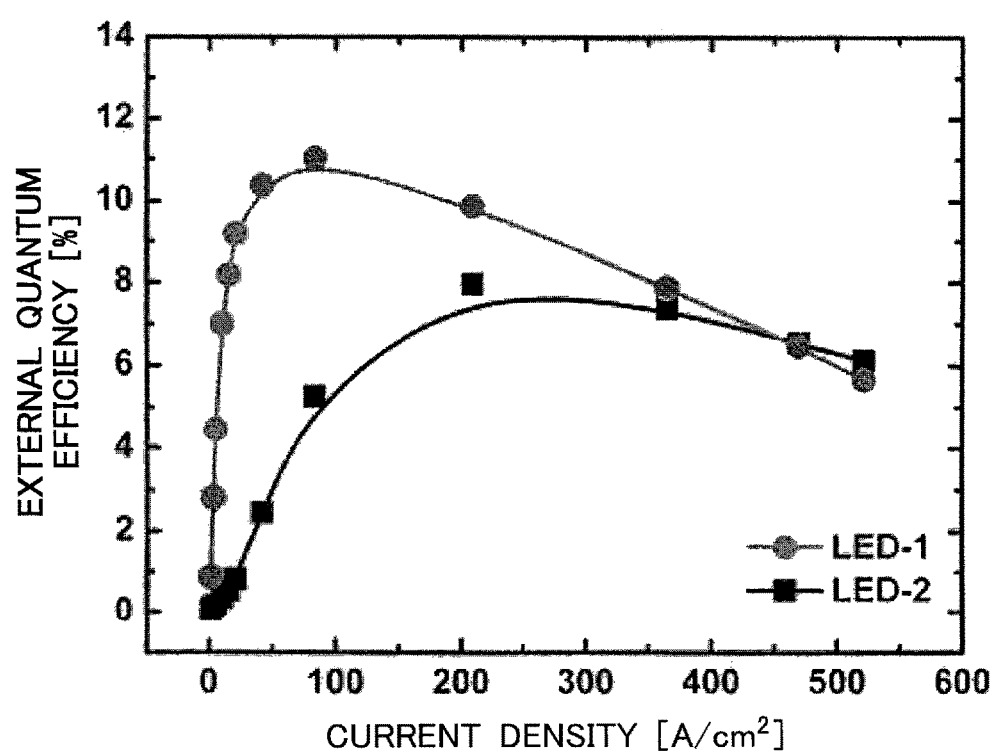
FIG. 2 shows a droop phenomenon, which is a disadvantage of a nitride-based LED.

FIG. 2 shows a droop phenomenon, which is a disadvantageous feature of a nitride-based LED. FIG. 2 presents how the external quantum efficiency [%] (plotted along the vertical axis) changes in relation to the current density [A/cm2] (plotted along the horizontal axis). Here, the external quantum efficiency denotes the percentage of the number of photons emitted outside an LED with respect to the number of electrons injected into the light emitting layer of the LED.

LEDs 1 and 2 have different characteristics from each other but are both manufactured by growing a GaN crystal layer on a sapphire substrate. In the case of a GaN crystal layer grown using a conventional crystal growth technique, the external quantum efficiency drops once the current density exceeds a certain value. In other words, the GaN crystal layer grown using the conventional crystal growth technique on a substrate made of a different material, such as a sapphire substrate, suffers from a droop phenomenon, according to which the light emission efficiency drops when large currents are applied for operation. In order to reduce the droop phenomenon, there is a need for high-quality GaN crystal layers with few defects and impurities.

In the conventional art, the initial substrate 101 that is made of a nitride semiconductor crystal is obtained by employing HVPE and using GaCl as a source material. When this technique is used to grow a high-quality nitride semiconductor crystal, however, the upper limit of the temperature (1100° C.) prevents a high-quality crystal from being obtained at the growth rate of 500 µm/h or higher. Embodiments of the present invention are designed to stably grow a nitride semiconductor crystal in the −C-axis direction and at high rates. In this manner, the embodiments of the present invention can easily manufacture nitride semiconductor crystals of large diameters.

Figure 3:
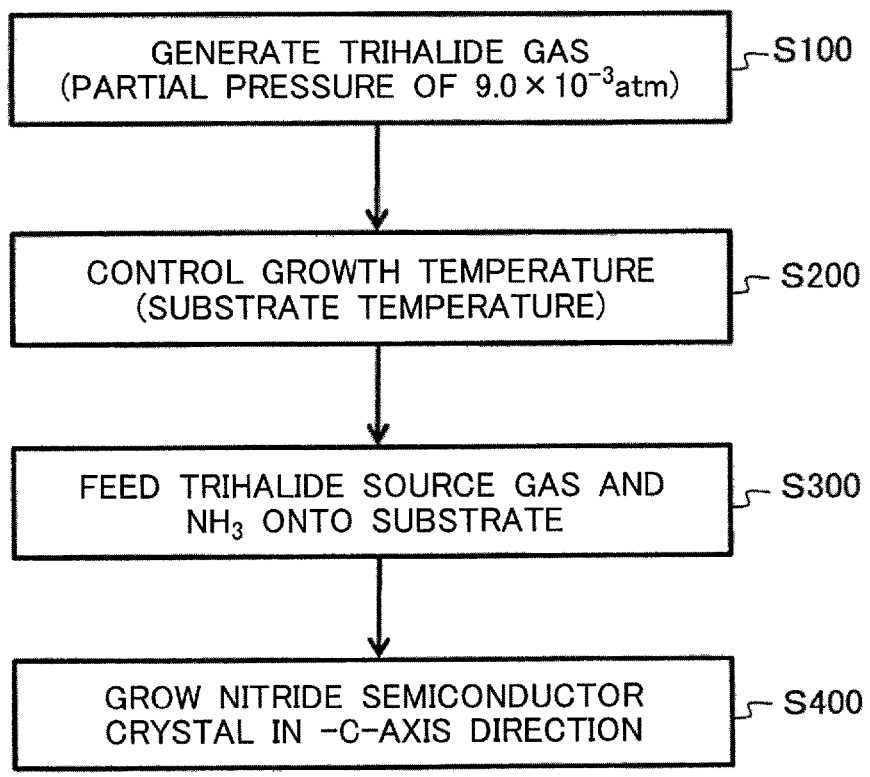
FIG. 3 is a flow chart showing an exemplary method of manufacturing a nitride semiconductor crystal.

FIG. 3 is a flow chart showing an exemplary method of manufacturing a nitride semiconductor crystal relating to an embodiment of the present invention. The manufacturing method according to the present exemplary embodiment uses a trihalide gas as the source gas and employs THVPE with the growth temperature being controlled, in order to realize the growth in the −C-axis direction.

In a step S100, a trihalide gas is produced that has a partial pressure of $9.0\times10^{-3}$ atm or higher and a high concentration. The improved growth rate can be achieved by increasing the partial pressure of the trihalide gas, which is supplied onto the substrate.

In a step S200, the temperature of the nitride semiconductor substrate 101 is controlled. By maintaining the temperature of the nitride semiconductor substrate 101 at a high temperature, the crystal quality can be maintained irrespective of the high growth rate while the impurity concentration of the nitride semiconductor crystal can be lowered. The growth temperature is preferably 1200° C. or higher, may be 1300° C. or higher or even 1400° C. or higher depending on what material is grown. For example, the growth temperature indicates the temperature of the nitride semiconductor substrate 101.

In a step S300, the trihalide source gas and an ammonia (NH$_3$) gas are fed onto the nitride semiconductor substrate 101. Since the trihalide source gas is used and the conditions including the growth temperature are optimized, the crystal can be grown in the −C-axis direction (step S400). Furthermore, the nitride semiconductor crystal can be easily formed to have larger diameters when grown in the −C-axis direction. Here, it should be noted that the order of the steps is not limited to the order shown in FIG. 3. For example, the steps S100 and S200 can be simultaneously performed, or the step S200 may be performed earlier than the step S100.

Figure 5:
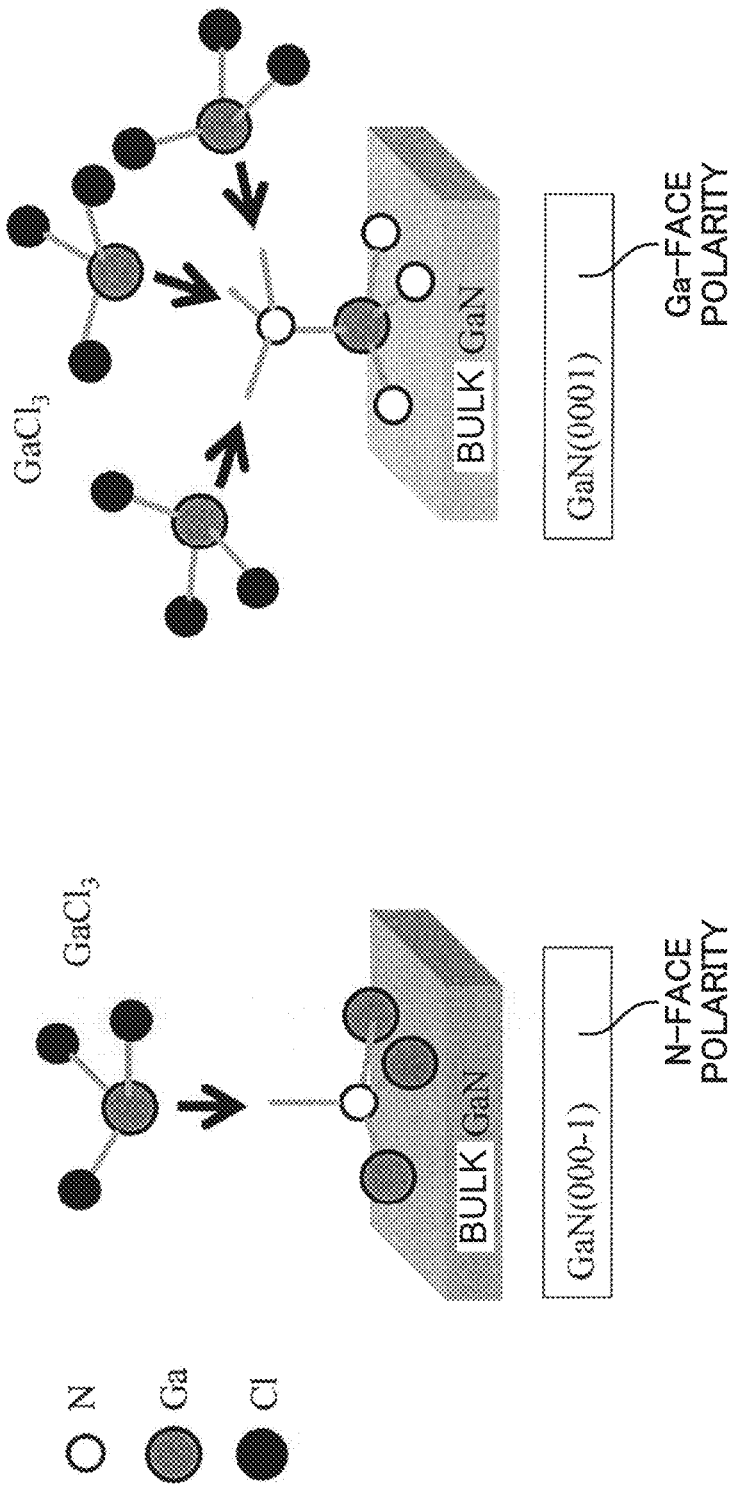
FIG. 5 shows the relation between the growth of a GaN crystal and the polarity of the GaN crystal.

FIGS. 4 and 5 are used to illustrate that selecting an appropriate source gas allows the crystal to grow in the −C-axis direction. The present specification primarily takes a GaN crystal layer as an example but the same applies to an AlN crystal.

FIG. 4 shows the structure and polarity of a GaN crystal layer. A GaN crystal generally has a hexagonal crystal structure in which Ga atoms (the black circles) and N atoms (the white circles) are bonded to each other. The polarity of a GaN crystal layer is selected between Ga-face polarity and N-face polarity depending on whether the GaN crystal is grown in the positive or negative direction in the C-axis direction. Here, the C-axis direction is perpendicular to the bottom surface of the hexagonal crystal.

When the GaN crystal layer exhibits Ga-face polarity, three of the four bonds of the Ga atom face toward the substrate and the remaining one bond perpendicularly faces toward the front surface. In this case, the growth plane of the GaN crystal layer is the +C plane (0001).

On the other hand, when the GaN crystal layer has the N-face polarity, the crystal structure with respect to the substrate is reversed in the C-axis direction, when compared with the case where the GaN crystal layer exhibits Ga-face polarity. To be specific, three of the four bonds of the Ga atom face toward the front surface and the remaining one bond perpendicularly faces toward the substrate. In this case, the growth plane of the GaN crystal layer is the −C plane (000−1).

FIG. 5 shows the relation between the growth of a GaN crystal and the polarity of the GaN crystal. FIG. 5 shows the reactions that occur when crystal growth is realized by using a gallium trichloride ($GaCl_3$) gas on the N-face (the left view) and the Ga-face (the right view). The $GaCl_3$ molecule is structured such that the three bonds of the Ga atom are respectively bonded to the chlorine atoms (the dark black circles).

Since the three bonds of the N atom face toward the front surface on the Ga-face, three $GaCl_3$ molecules simultaneously attempt to form a bond, which causes steric effects. Thus, the Ga atoms of the $GaCl_3$ gas have difficulties in forming a bond with the bonds of the N atom and are thus not easily taken into the crystal. Accordingly, the epitaxial growth does not proceed smoothly.

On the N-face, in contrast, one bond of the N atom faces toward the front surface during the reaction with the $GaCl_3$ gas. The Ga atoms of the $GaCl_3$ gas form a bond with the bonds of the N atom more easily on the N-face than on the Ga-face and thus are easily taken into the crystal. Accordingly, the epitaxial growth smoothly proceeds.

Here, when a gallium monochloride (GaCl) gas is used to grow a GaN crystal, steric effects occur less easily than when using the $GaCl_3$ gas. Therefore, the GaCl gas can adhere to both of the Ga-face and the N-face.

Stated differently, since the GaCl gas adhere to both of the Ga-face and the N-face, the growing direction is easily reversed during the crystal growth using the GaCl gas and stable crystal growth in the −C-axis direction cannot be realized. In addition, the use of the GaCl gas makes it more difficult to grow a nitride semiconductor crystal in the −C-axis direction on the initial substrate 301, which is made of a different material.

On the other hand, the use of the $GaCl_3$ gas makes it easier to stably grow the nitride semiconductor crystal in the −C-axis direction since the $GaCl_3$ gas is more likely to adhere to the N-face than to the Ga-face. In addition, even when the growth first proceeds in the +C-axis direction, the growing direction is reversed so that the crystal growth proceeds in the −C-axis direction. Accordingly, the nitride semiconductor crystal can be grown in the −C-axis direction on the initial substrate 301, which is made of a different material. As described above, the nitride semiconductor crystal can be grown in the −C-axis direction by selecting an appropriate source gas. However, it should be noted that the growth temperature is preferably set high since the growth in the −C-axis direction may be mixed with the growth in the +C-axis direction despite the use of the $GaCl_3$ gas as the source material when, for example, the growth temperature is set low.

Figure 6:
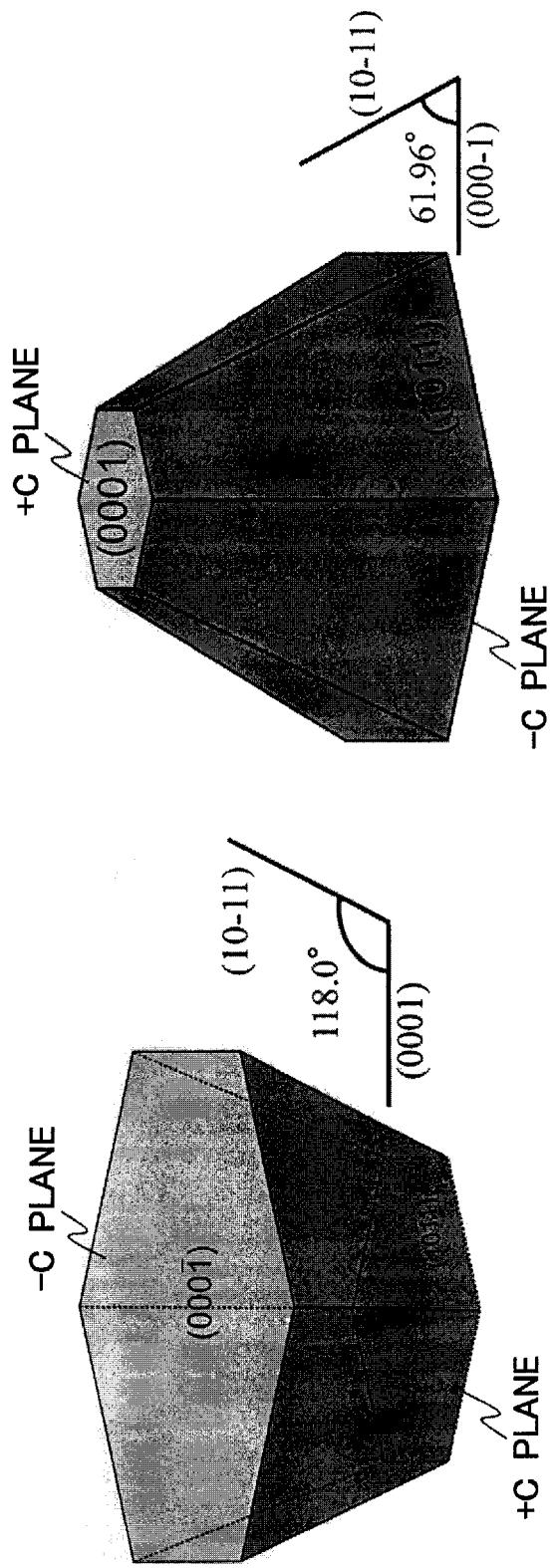
FIG. 6 shows the shapes of GaN crystals grown in the –C-axis direction and the +C-axis direction.

FIG. 6 shows the shapes of GaN crystal layers grown in the −C-axis direction and the +C-axis direction. The left view shows the shape of the crystal layer grown in the −C-axis direction and the right view shows the shape of the crystal layer grown in the +C-axis direction. The shapes of the crystal layers shown in FIG. 6 have been proved true through the ab initio calculations and growth experiments.

During the growth in the +C-axis direction, the (10−11) plane facet appears. Here, an acute angle (for example, 61.96°) is formed between the (000−1) plane and the (10−11) plane of the crystal layer grown in the +C-axis direction. Therefore, the area of the +C plane decreases as the crystal growth proceeds in the +C-axis direction.

During the growth in the −C-axis direction, the (10−11) plane facet appears as with the growth in the +C-axis direction. However, a blunt angle (for example, 118.0°) is formed between the (0001) plane and the (10−11) plane of the crystal layer grown in the −C-axis direction. Therefore, the crystalline area of the −C plane is larger than the crystalline area of the +C plane when the crystal growth proceeds in the −C-axis direction. This means that nitride semiconductor crystals having large diameters can be easily manufactured by growing the crystals in the −C-axis direction. In other words, when the crystal is grown in the −C-axis direction, the angle formed between the (0001) plane and the (10−11) plane may be a blunt angle larger than 90° and smaller than 180°. Here, the facet is not limited to the (10−11) plane, and may be any plane that forms a blunt angle with the (0001) plane, such as the (11-22) plane or the (10−12) plane.

FIG. 7 is a table comparing the characteristics of nitride semiconductor crystals obtained by different growth techniques. Nitride semiconductor crystals can be grown using techniques such as THVPE, HVPE, metal organic vapor phase epitaxy (MOVPE), molecular beam epitaxy (MBE) and the like. In FIG. 7, the circles indicate that the corresponding techniques can manufacture crystal layers satisfying the conditions (i) to (v) presented in FIG. 7, the triangles indicate that the corresponding techniques may possibly be capable of manufacturing crystal layers satisfying the conditions (i) to (v) but are actually unlikely to succeed, and the crosses indicate that the corresponding techniques cannot manufacture crystal layers satisfying the conditions (i) to (v).

The conventional THVPE technique sets the growth temperature to be lower than 1300° C. and the partial pressure of the $GaCl_3$ gas fed onto the substrate to be equal to or lower than $8.0 \times 10^{-3}$ atm. The THVPE technique according to the present invention sets the growth temperature to be equal to or higher than 1200° C. and lower than 1300° C. and the partial pressure of the $GaCl_3$ gas fed onto the substrate to be equal to or higher than $9.0 \times 10^{-3}$ atm. The THVPE technique according to the present invention can set the growth temperature to be equal to or higher than 1300° C.

FIG. 7 shows whether the crystal layer grown by each growth technique can satisfy various combinations of the conditions (i) to (v). The conditions (i) to (v) are as follows: (i) grown in the −C-axis direction, (ii) having a diameter of 4 inches, a dislocation density of $1 \times 10^5/cm^2$ or lower, and a curvature radius of 100 m or more, (iii) having a thickness of 100 μm or more, (iv) having an impurity concentration of $1\times10^{17}/cm^3$ or lower, and (v) having a diameter of 3 inches and a thickness of 5 mm.

The THVPE technique is designed to grow a GaN crystal layer using a $GaCl_3$ gas and an $NH_3$ gas. According to the THVPE technique, a crystal layer can be grown at high temperatures and rates using a $GaCl_3$ gas. The GaN crystal growth technique using the $GaCl_3$ gas can achieve stable crystal layer growth in the −C-axis direction (the condition (i)) by optimizing the growth conditions.

The nitride semiconductor crystal manufacturing equipment used in conjunction with the conventional THVPE technique does not allow the concentration of the $GaCl_3$ gas to be substantially above $8.0\times10^{-3}$ atm. For this reason, the growth rate radically drops when the growth temperature reaches 1200° C. or higher. A low growth temperature easily introduces oxygen ($O_2$) and silicon (Si) into the crystal during the growth and cannot achieve the lowered impurity concentration of $1\times10^{17}/cm^3$ or lower (the condition (iv)).

Furthermore, since the nitride semiconductor crystal manufacturing equipment used in conjunction with the conventional THVPE technique have difficulties in employing a high $GaCl_3$ gas concentration, the growth rate has been approximately 180 μm/h. In particular, when the $GaCl_3$ gas concentration is low, the growth rate radically drops at the growth temperature of 1200° C. or higher. Generally speaking, irrespective of the growth rate, the duration of continuous operation for crystal growth is limited due to the redeposits that adhere to the inner walls of the growth chamber. Therefore, when the growth rate is high, uninterrupted deposition can produce a thick film, and when the growth rate is low, uninterrupted deposition can only produce a thin film. Accordingly, it has been very difficult for the conventional THVPE technique to grow a very thick GaN crystal layer of 5 mm or more (the condition (v)).

According to the THVPE technique relating to the present exemplary embodiment, crystal growth takes place under such conditions that the growth temperature is set to equal to or higher than 1200° C. and lower than 1300° C., and the partial pressure of the $GaCl_3$ gas fed onto the substrate is $9.0\times10^{-3}$ atm or higher, for example. Under these conditions, a growth rate of 300 μm/h or higher can be accomplished. In addition, the increased partial pressure of the $GaCl_3$ gas can achieve a growth rate of 1 mm/h or higher, which in turn can grow a nitride semiconductor crystal having a very large thickness (5 mm or more) satisfying the conditions (i) and (v).

According to the THVPE technique relating to the present exemplary embodiment, the crystal layer is grown at a growth temperature of 1300° C. or higher, for example. The THVPE technique can achieve a growth rate of 0.15 to 1 mm/h or higher when the growth temperature is 1300° C. or higher. In addition, since the growth temperature is high, few impurities are introduced, which can offer a highly transparent nitride semiconductor crystal. As described above, the THVPE technique relating to the present exemplary embodiment can grow a nitride semiconductor crystal satisfying the conditions (i) to (iv). Since the THVPE technique relating to the present exemplary embodiment enables crystal growth at a high temperature of 1300° C. or higher, the impurity concentration can be lowered to $1\times10^{16}/cm^3$ or lower, or even $1\times10^{15}/cm^3$ or lower.

To grow a GaN crystal using the HVPE technique, a gallium monochloride-ammonia (GaCl—$NH_3$)-based source material has been used. Using a GaCl gas, the HVPE technique cannot realize stable crystal growth in the −C-axis direction (the condition (i)). In addition, as described with reference to FIG. 8, the HVPE technique cannot set the growth temperature high (1200° C. or higher) since a high growth temperature results in a lower driving force for the growth and thus a lower growth rate. As a result, the impurity concentration is high (the condition (iv)).

The MOVPE technique uses organic source materials such as trimethylgallium (TMG) and the like and has a high impurity concentration for carbon (C) (the condition (v)). It is known that the MOVPE technique can grow crystalline thin films in the −C-axis direction under certain conditions. However, the MOVPE technique has never succeeded in growing crystalline films of 100 μm or more in the −C-axis direction (the condition (v)).

The MBE technique can achieve crystal growth in the −C-axis direction if the source material ratio is strictly controlled. However, the MBE technique has an extremely lower growth rate of approximately several dozen to several hundred nanometers/h than other growth techniques. Thus, it takes several weeks to months to grow a GaN crystal layer of 100 μm or more. Taking into consideration the deposits onto the inner walls of the apparatus and the cost required to operate the apparatus over a long duration, the MBE technique cannot be employed to grow thick GaN crystals. Additionally, the MBE technique requires ultrahigh vacuum within the chamber, which limits the way of controlling the temperature of the materials to heating of the substrate and the like, and thus makes it difficult to maintain the materials at high temperatures. It is difficult to control the temperature of the thick GaN crystal layer to be uniform using limited heating sources. The MBE technique cannot easily grow a thick GaN crystal layer of 100 μm or more. Here, since it is difficult to maintain a high growth temperature, the grown nitride semiconductor crystal disadvantageously contain many oxygen impurities. For example, the nitride semiconductor crystal grown using the MBE technique has a high oxygen impurity concentration of approximately $1\times10^{17}/cm^3$ (the condition (iv)). Furthermore, it takes as many as 57 years to accomplish a thickness of 5 mm or more (the condition (v)) when the MBE technique is applied under typical growth conditions.

Nitride semiconductor crystals (bulk) can be manufactured using the Ammonothemal method, the Na flux method and the like, which can only provide crystals having a diameter of approximately 2 inches according to the state of the art and are not suitable for manufacturing crystals having larger diameters and thicknesses. As described above, the Ammonothermal method and the like cannot provide crystal layers satisfying the conditions of diameters of 4 inches or more, or thicknesses of 5 mm or more.

Figure 8:
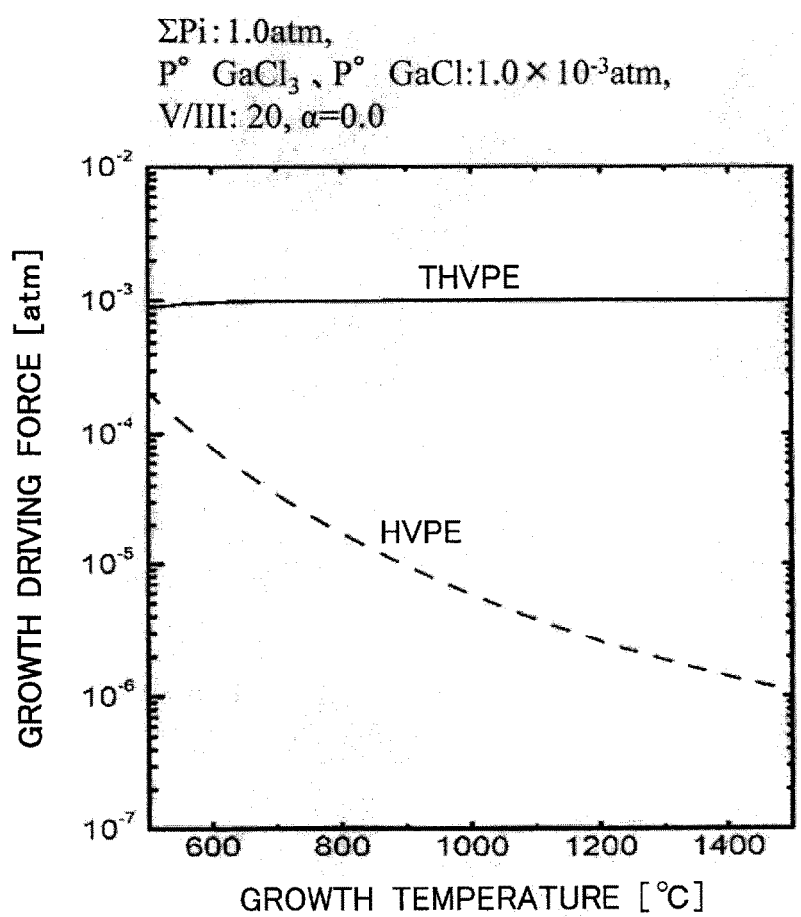
FIG. 8 compares the growth driving forces for the HVPE and THVPE techniques.

FIG. 8 compares the growth driving forces for the HVPE (the dotted line) and THVP (the solid line) techniques. FIG. 8 shows the growth driving force [atm] (plotted along the vertical axis) in relation to the growth temperature [° C.] (plotted along the horizontal axis). In the shown example, the total pressure $\Sigma Pi$ is 1.0 atm and the partial pressures of the $GaCl_3$ gas and the GaCl gas (P° $GaCl_3$, P° GaCl) are $1.0\times10^{-3}$ atm. The V/III ratio, which denotes the ratio in supply of the Group-V source gas to the Group-III source gas, is 20 and the ammonia degradation rate a is 0.0.

The growth driving force is a parameter in proportion to the growth rate of the crystal layer. To be specific, the growth rate is expressed by the formula of the growth rate=K×the growth driving force, where K denotes the mass transfer coefficient. FIG. 8 indicates that a high growth temperature results in a lower growth driving force for the HVPE technique but that the growth driving force does not drop even if the growth temperature becomes high when the THVPE technique is employed. This means that the THVPE technique can grow GaN crystal layers at high rates at higher temperatures than the HVPE technique.

Figure 9:
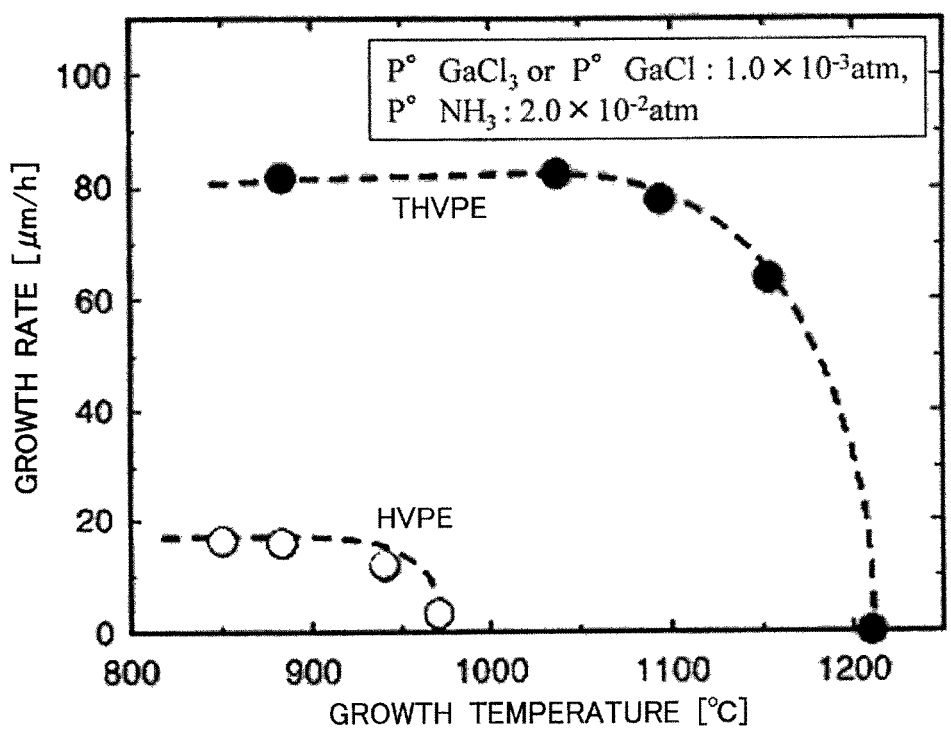
FIG. 9 is a graph comparing the growth rates for the HVPE and THVPE techniques.

FIG. 9 is a graph comparing the growth rates for the HVPE and THVPE techniques, which are measured with the use of various source materials in the same apparatus. FIG. 9 shows how the growth rate [μm/h] (plotted along the vertical axis) varies in relation to the growth temperature [° C.] (plotted along the horizontal axis). In the present example, the partial pressures of the $GaCl_3$ gas (P° $GaCl_3$) and the GaCl gas (P° GaCl) fed into the growth chamber are $1.0\times10^{-3}$ atm. The partial pressure of the $NH_3$ gas fed into the growth chamber (P° $NH_3$) is $2.0\times10^{-2}$ atm.

In the present example, when the HVPE technique is employed, the growth rate drops when the growth temperature reaches the range of 900° C. and 1000° C. When the THVPE technique is employed, on the other hand, the growth rate drops when the growth temperature reaches the range of 1100° C. and 1200° C. That is to say, the growth rate is more unlikely to drop as the growth temperature rises when the THVPE technique is employed than when the HVPE technique is employed. Furthermore the THVPE technique achieves a higher growth rate than the HVPE technique provided that the partial pressure of the $GaCl_3$ gas for the THVPE technique is the same as the partial pressure of the GaCl gas for the HVPE technique.

Figure 10:
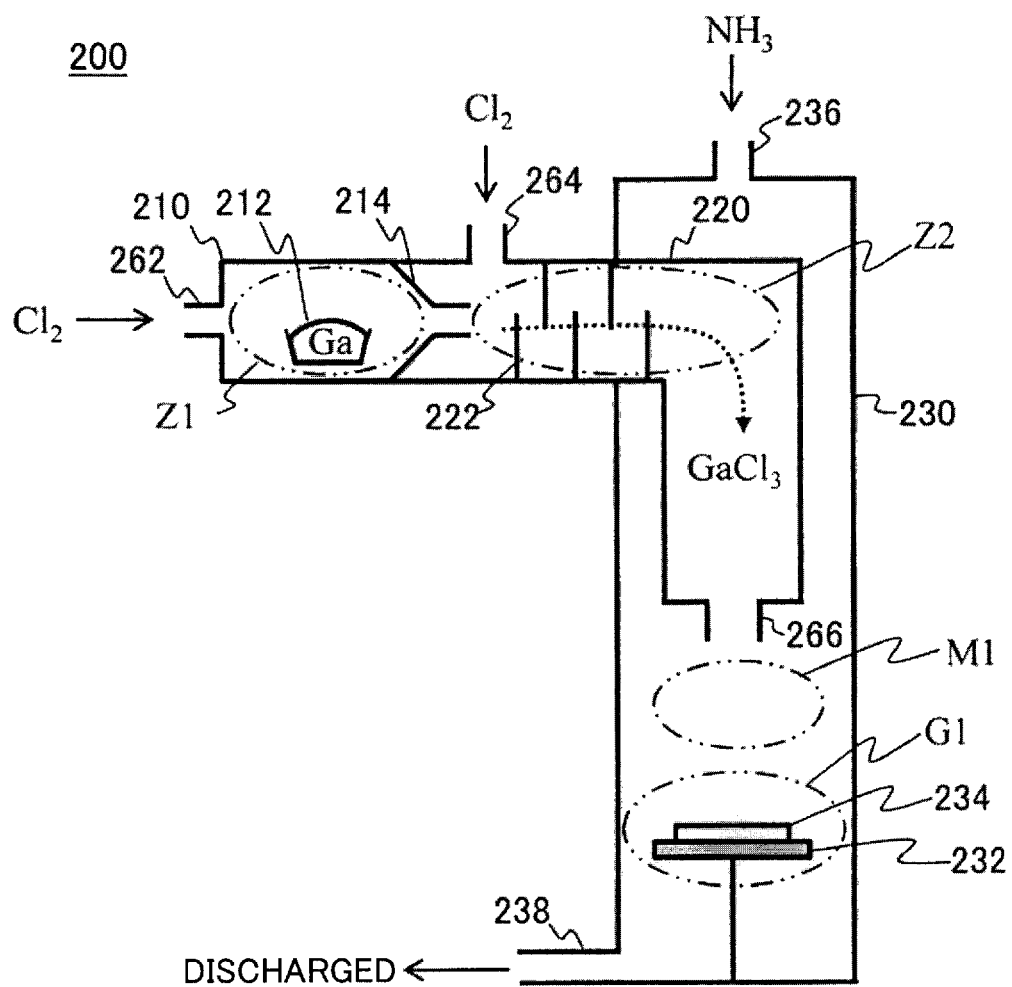
FIG. 10 schematically shows a nitride semiconductor crystal manufacturing equipment 200.

FIG. 10 schematically shows a nitride semiconductor crystal manufacturing equipment 200 using the THVPE technique. In the present exemplary embodiment, the nitride semiconductor crystal manufacturing equipment 200 includes a first reaction chamber 210, a second reaction chamber 220 and a growth chamber 230. The first reaction chamber 210 and the second reaction chamber 220 are shown as an example of the gas feeder configured to generate and feed a trihalide gas onto a substrate. The first reaction chamber 210 and the second reaction chamber 220 may be provided in different reaction tubes. The first reaction chamber 210 and the second reaction chamber 220 are divided from each other by a preventing structure 214 therebetween.

The first reaction chamber 210 includes a first halogen gas inlet 262 and a first zone Z1. In the first zone Z1, metallic gallium 212 is placed.

The first halogen gas inlet 262 is configured to feed a halogen gas to the first zone Z1 in which the metallic gallium 212 is placed.

The second reaction chamber 220 includes a second halogen gas inlet 264 and a first outlet 266, and a second zone Z2. Into the second zone Z2, the gas generated in the first reaction chamber 210 is fed.

The preventing structure 214 is positioned between the first reaction chamber 210 in which a first process is performed and the second reaction chamber 220 in which a second process is performed. In this manner, the preventing structure 214 prevents a drop in the concentration of the GaCl gas generated by the first process.

For example, the preventing structure 214 is the path between the first reaction chamber 210 and the second reaction chamber 220. The cross-sectional area of the path is smaller than the cross-sectional area of the first reaction chamber 210 and the cross-sectional area of the second reaction chamber 220. With such a configuration, the nitride semiconductor crystal manufacturing equipment 200 can provide the increased pressure in the first zone Z1.

In the first reaction chamber 210, the first zone Z1 can have the increased pressure, which may allow the increased partial pressure of the chlorine gas ($Cl_2$). For example, the partial pressure of the $Cl_2$ gas fed into the first reaction chamber 210 is $1.0\times10^{-3}$ atm or higher.

The second reaction chamber 220 includes a plurality of partitions 222 configured to slow the flow rate of the $GaCl_3$ gas. In this manner, the nitride semiconductor crystal manufacturing equipment 200 can have the increased flow rate of the $Cl_2$ gas at the second halogen gas inlet 264 and the increased pressure in the second zone Z2.

In the present exemplary embodiment, the nitride semiconductor crystal manufacturing equipment 200 adjusts the partial pressure of the gallium trihalide gas (P° $GaCl_3$) fed onto the substrate so that the partial pressure becomes $9.0\times10^{-3}$ atm or higher. In the present exemplary embodiment, the partial pressure of the $GaCl_3$ gas (P° $GaCl_3$) is allowed to be higher than the conventional level.

To be specific, the partial pressure of the gallium trihalide gas fed onto the substrate is adjusted to fall within the range of no less than $9.0\times10^{-3}$ atm and no more than $1.0\times10^{-1}$ atm. In addition, the partial pressure of the $NH_3$ gas in the growth chamber 230 (P° $NH_3$) is adjusted to fall within the range of no less than $5.0\times10^{-2}$ atm and no more than $2.5\times10^{-1}$ atm.

<First Process>

The first process generates a gallium monohalide gas by a reaction between the metallic gallium 212 and a halogen gas. The halogen gas is, for example, a $Cl_2$ gas, a bromine ($Br_2$) gas, and an iodine ($I_2$) gas.

To be specific, the highly pure $Cl_2$ gas is continuously fed onto the metallic gallium 212 to generate a GaCl gas through the contact between the metallic gallium 212 and the $Cl_2$ gas. The reaction induced in the first process to generate the GaCl gas can be represented by the following reaction formula (1).

$$Ga(l) + \tfrac{1}{2}Cl_2(g) \rightarrow GaCl(g) \tag{1}$$

Here, the letters (l) and (g) respectively mean that the corresponding materials are in the liquid and gaseous states.

In the first process, the $Cl_2$ gas is fed together with a carrier gas. The carrier gas is an inert gas such as a nitrogen gas, an argon gas or a helium gas, or a gas mixture containing at least one of these. The pressure is adjusted in the first zone Z1 in such a manner that the partial pressure of the $Cl_2$ gas is $1.0\times10^{-3}$ atm or higher and the total pressure is 1 atm, for example.

The reaction in the first process generates an gallium chloride gas in addition to the GaCl gas. The gallium chloride indicates general chlorides of gallium such as, gallium monochloride, gallium dichloride, gallium trichloride, and the dimer of gallium trichloride.

The first process preferably generates a gallium chloride gas primarily containing a GaCl gas. The amount of the GaCl gas preferably accounts for 99 mol % or more, more preferably 99.9 mol % or more of the total amount of the gallium chloride gas generated.

The first reaction chamber 210 may be externally provided with an external heating element. For example, the external heating element may be a resistance-type heater, a high-frequency heating device, a lamp heater or the like. The external heating element heats the first zone Z1 and the second zone Z2 independently from each other. Here, the external heating element may be capable of simultaneously heating the first zone Z1 and the second zone Z2. In addition to the external heating element, the nitride semiconductor crystal manufacturing equipment 200 may further include a heating element that is capable of independently heating the metallic gallium 212.

The reaction temperature in the first process is preferably 300° C. to 1000° C., more preferably 500° C. to 900° C., and especially preferably 700° to 850°. The reaction temperature of 300° C. or higher in the first process improves the selectivity of the generated GaCl gas. The reaction temperature of 1000° C. or lower in the first process can prevent the reaction tubes made of quartz or the like from being damaged.

<Second Process>

The second process generates a gallium trihalide gas by a reaction between the generated gallium monohalide gas and a halogen gas. To be specific, the second process induces a reaction between the gallium monochloride gas generated in the first process and a Cl2 gas. The reaction induced in the second process to generate the gallium trichloride gas can be represented by the following reaction formula (2).

$$GaCl(g)+Cl2(g) \rightarrow GaCl3(g) \qquad (2)$$

In the second process, the $Cl_2$ gas is fed together with a carrier gas. The carrier gas is an inert gas such as a nitrogen gas, an argon gas or a helium gas, or a gas mixture containing at least one of these, for example. The pressure is adjusted in the second zone Z2 in such a manner that the partial pressure of the $Cl_2$ gas is $2.0 \times 10^{-3}$ atm and the total pressure is 1 atm, for example.

The reaction temperature in the second process is preferably 150° C. to 1000° C., more preferably 200° C. to 900° C., and especially preferably 500° C. to 700° C. When the reaction temperature is 150° C. or higher in the second process, the $GaCl_3$ gas is more likely to be generated selectively.

The first outlet 266 is configured to feed the $GaCl_3$ gas generated in the second process into the growth chamber 230. The first outlet 266 may be positioned inside the growth chamber 230.

<Growing Step>

The growing step takes place in a crystal growing unit G1 of the growth chamber 230, where the $GaCl_3$ gas generated in the second process reacts with an $NH_3$ gas to grow a GaN crystal layer.

The growth chamber 230 includes an ammonia gas inlet 236, a susceptor 232 and a second outlet 238. An initial substrate 234 is placed on the susceptor 232.

The ammonia gas inlet 236 is configured to feed a $NH_3$ gas, together with a carrier gas, into a gas mixer unit M1. The carrier gas is an inert gas such as a nitrogen gas, an argon gas or a helium gas, or a gas mixture containing at least one of these, for example. The gas mixer unit M1 mixes the $NH_3$ gas and the $GaCl_3$ gas together to provide a source gas.

The susceptor 232 is shown as an example of the temperature controller configured to hold the initial substrate 234 and control the temperature of the initial substrate 234 to be a predetermined growth temperature. The susceptor 232 is formed using, for example, sintered boron nitride, which is heat- and corrosion-resistant, carbon covered with sintered boron nitride, or the like. The susceptor 232 has a carbon heater provided therein to raise the temperature of the initial substrate 234.

The source gas, which contains the $NH_3$ gas and the $GaCl_3$ gas and is generated in the gas mixer unit M1, is fed to the initial substrate 234. This allows a GaN crystal layer to grow on the initial substrate 234 in the crystal growing unit G1. For example, the initial substrate 234 is a monocrystalline substrate such as a sapphire (0001) substrate, a gallium arsenide substrate, a silicon carbide substrate, a gallium nitride substrate. In the nitride semiconductor crystal manufacturing equipment 200, a barrier gas may be fed in such a manner to surround the $GaCl_3$ gas from along the periphery of the first outlet 266. In this manner, the $GaCl_3$ gas and the $NH_3$ gas are mixed together in the vicinity of the crystal growing unit G1, which can prevent redeposits onto the inner walls of the growth chamber 230. Accordingly, the nitride semiconductor crystal manufacturing equipment 200 relating to the present exemplary embodiment can prevent long-hour operation from causing a drop in the growth rate. Here, the barrier gas is an inert gas such as a nitrogen gas or an argon gas, for example.

The second outlet 238 is configured to discharge outside the unnecessary gas resulting from the GaN crystal growth and unreacted gas. The unnecessary gas resulting from the GaN crystal growth is hydrogen chloride HCl, hydrogen $H_2$ or the like.

The nitride semiconductor crystal manufacturing equipment 200 relating to the present exemplary embodiment can grow the GaN crystal layer on the nitride semiconductor substrate 101 in the −C-axis direction at the rate of 1 mm/h or higher. The growth temperature of the GaN crystal layer is 1200° C. or higher. The nitride semiconductor crystal manufacturing equipment 200 relating to the present exemplary embodiment can realize the crystal growth in the −C-axis direction and thus grow a thicker layer, which can result in a crystal layer having a larger diameter. To be specific, the nitride semiconductor crystal manufacturing equipment 200 relating to the present exemplary embodiment can grow a nitride semiconductor crystal having a diameter of 3 inches or more and a thickness of 5 mm or more. For example, the GaN crystal layer manufactured using the nitride semiconductor crystal manufacturing equipment 200 has a thickness of 1 cm or 5 cm or more. Therefore, such a GaN crystal layer can be easily sliced into a plurality of GaN substrates.

The above describes an exemplary manufacturing method using gallium as the Group-III source material, but aluminum can be used as the Group-III source material. For example, by setting the growth temperature at 1400° C. or higher, an AlN crystal layer having a diameter of 3 inches or more and a thickness of 5 mm or more can be obtained in the same manner as the GaN crystal layer. The following describes the differences between the AlN crystal layer manufacturing method and the GaN crystal layer manufacturing method.

In the first reaction chamber 210, metallic aluminum and the $Cl_2$ gas react with each other, which generates an aluminum trichloride ($AlCl_3$) gas. In the first reaction chamber 210, the first zone Z1 is maintained at a low temperature of 750° C. or lower and an aluminum monochloride (AlCl) gas is thus prevented from being generated. Accordingly, the nitride semiconductor crystal manufacturing equipment 200 can prevent the first reaction chamber 210 made of quartz from being eroded by the AlCl gas.

Since the $AlCl_3$ gas is generated in the first reaction chamber 210, the $Cl_2$ gas need not be fed into the second reaction chamber 220 through the second halogen gas inlet 264. When the AlN crystal layer is grown, the second reaction chamber 220 may not be used and the $AlCl_3$ gas may be directly fed from the first reaction chamber 210 to the growth chamber 230.

The nitride semiconductor crystal manufacturing equipment 200 relating to the present exemplary embodiment can grow the AlN crystal layer on the nitride semiconductor substrate 101 in the −C-axis direction at the rate of 1 mm/h or higher. The growth temperature for the AlN crystal layer is 1400° C. or higher. Furthermore, the AlN crystal layer manufactured by the nitride semiconductor crystal manufacturing equipment 200 relating to the present exemplary embodiment has a diameter of 4 inches or more, is warped with a curvature radius of 100 m or more, and has an impurity concentration of $1\times10^{17}/cm^3$ or lower. Since the nitride semiconductor crystal manufacturing equipment 200 relating to the present exemplary embodiment realizes the growth at high temperatures of 1400° C. or higher, the lowered impurity concentration of $1\times10^{16}/cm^3$ or lower, or even $1\times10^{15}/cm^3$ or lower can be achieved.

Figure 11:
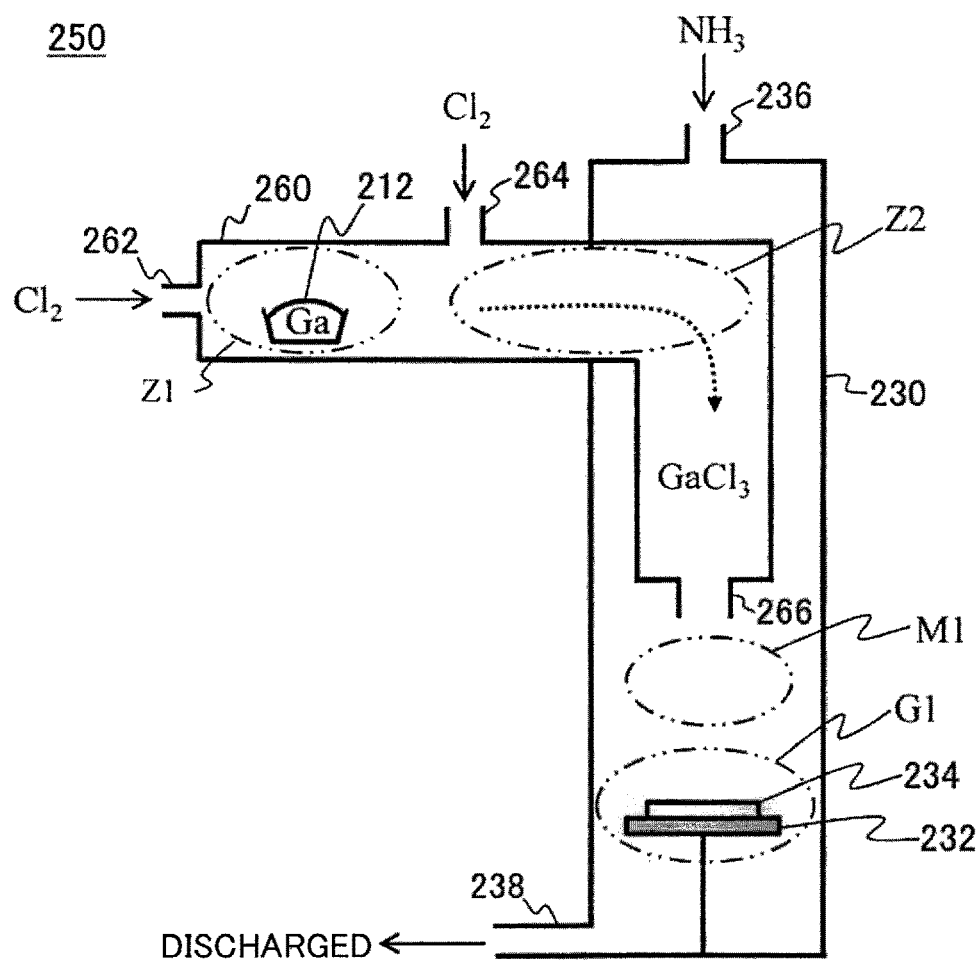
FIG. 11 schematically shows a conventional nitride semiconductor crystal manufacturing equipment 250.

FIG. 11 schematically shows a conventional nitride semiconductor crystal manufacturing equipment 250. The conventional nitride semiconductor crystal manufacturing equipment 250 is different from the nitride semiconductor crystal manufacturing equipment 200 in terms of having a common reaction chamber 260, instead of the first and second reaction chambers 210 and 220.

The common reaction chamber 260 includes a first halogen gas inlet 262, a second halogen gas inlet 264, and a first outlet 266. The common reaction chamber 260 includes a first zone Z1 in which a first process takes place and a second zone Z2 in which a second process takes place.

In the conventional nitride semiconductor crystal manufacturing equipment 250, the first zone Z1 and the second zone Z2 are not separated from each other in the common reaction chamber 260. Therefore, the conventional nitride semiconductor crystal manufacturing equipment 250 cannot achieve a sufficiently high flow rate for the chlorine gas $Cl_2$ at the first halogen gas inlet 262 and a sufficiently high pressure in the first zone Z1.

Figure 12:
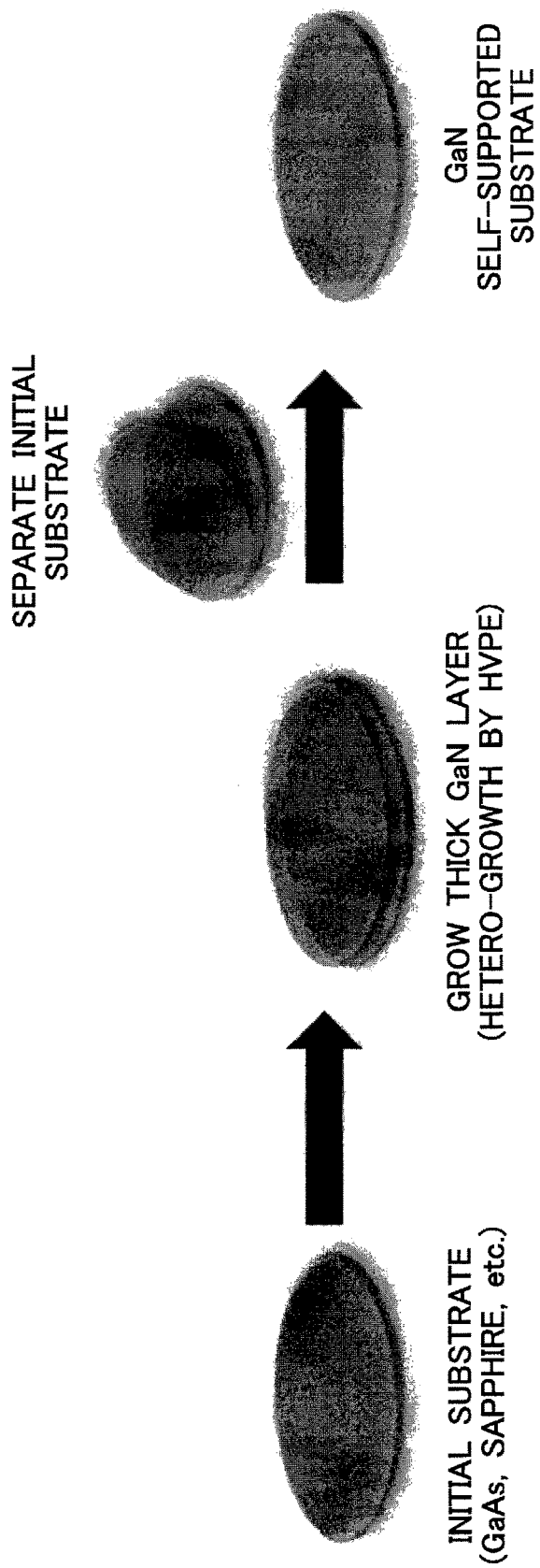
FIG. 12 shows a conventional manufacturing process for a nitride semiconductor substrate.

FIG. 12 shows a conventional manufacturing process for a nitride semiconductor substrate. The conventional GaN substrate is manufactured in the following manner. A thick GaN crystal layer is hetero-epitaxially grown on an initial substrate, which is made of GaAs, sapphire or the like, using the HVPE technique. The initial substrate is then separated, so that the self-supported GaN substrate is obtained. When the HVPE technique is employed, however, the growth rate is low and the crystal cannot be stably grown in the −C-axis direction. Accordingly, it is required to grow the GaN substrates one by one, resulting in raising the cost of manufacturing each GaN substrate to several hundred thousand yen. While techniques have been successfully established to grow and slice 18-inch silicon bulk crystals into silicon wafers, there have been no techniques established to grow and slice GaN bulk crystals into GaN wafers. The conventional nitride semiconductor substrate manufacturing process provides GaN substrates of approximately 2 inches, which can be currently only utilized to manufacture blue-violet LDs and high-luminosity LEDs and are not large enough to manufacture power devices.

Figure 13:
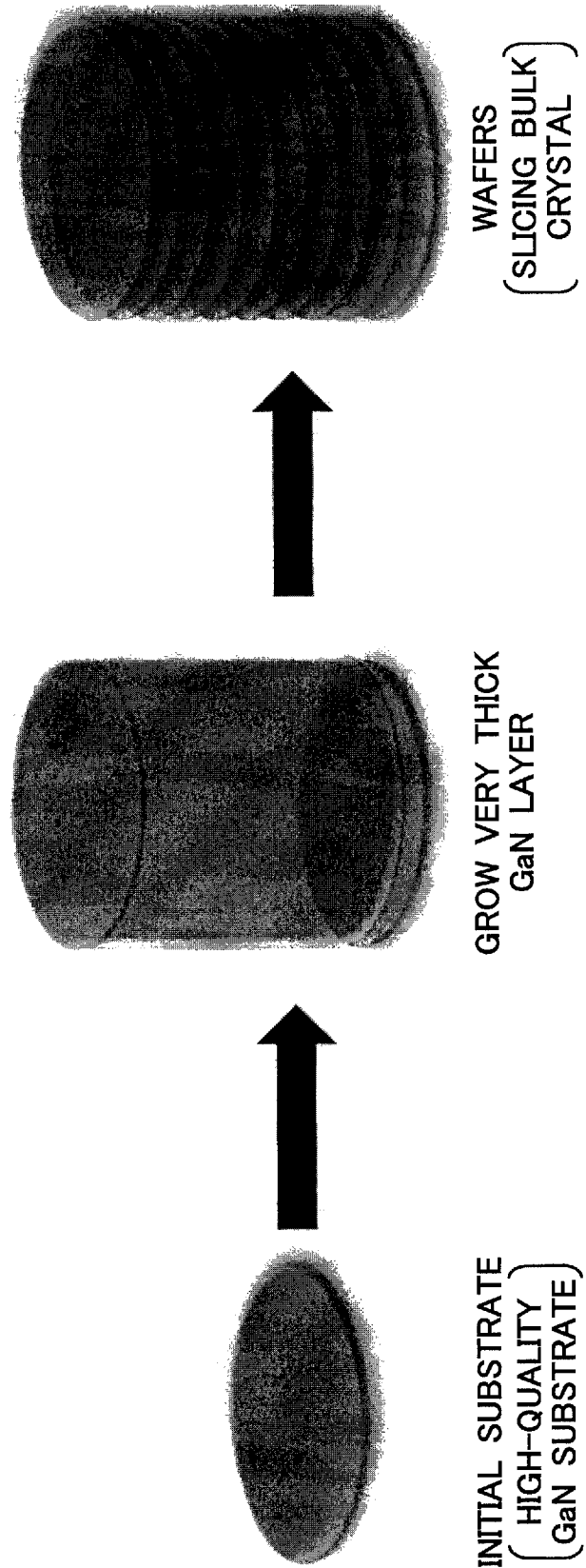
FIG. 13 shows a manufacturing process for a GaN substrate according to the present invention.

FIG. 13 shows a manufacturing process for a GaN substrate according to the present invention. The manufacturing process relating to the present exemplary embodiment manufactures, as the initial substrate, a high-quality GaN substrate by means of the techniques such as the Na flux method and the Ammonothermal method. Following this, the THVPE technique relating to the present invention is utilized to homoepitaxially grow a very thick GaN crystal layer. Subsequently, GaN wafers are sliced from the grown very thick GaN bulk crystal.

After growing the GaN crystal layer or the AlN crystal layer in the −C-axis direction, slicing off the top portion of the nitride semiconductor crystal and further growing the crystal on the sliced-off top portion of the nitride semiconductor crystal may be repeatedly performed. By repeatedly performing the slicing-off of the top portion of the crystal and growing the crystal on the sliced-off top portion, the improved quality and the increased diameter of the crystal layer can be accomplished. In this manner, the dislocation density on the −C plane can be lowered to $1\times10^5$ $cm^{-2}$ or lower, or $1\times10^3$ $cm^{-2}$ or lower. Eventually, a crystal layer free from dislocations on the −C plane can be manufactured.

To be specific, the manufacturing method relating to the present exemplary embodiment can provide a nitride semiconductor crystal layer that has a diameter of 4 inches or more, is warped with a curvature radius of 100 m or more, and has an impurity concentration of $1\times10^{17}/cm^3$ or lower. In addition, the manufacturing method of the present exemplary embodiment can provide a nitride semiconductor crystal having a dislocation density of $1\times10^5$ $cm^{-2}$ or lower on the −C plane.

The currently commercially available GaN substrates have a diameter of, at most, approximately 2 inches and, when it comes to AlN substrates, the standard substrates have a diameter of 1 inch or less. On the other hand, the present exemplary embodiment can achieve high-rate crystal growth in the −C-axis direction, which allows GaN bulk thick crystals to be formed. In other words, since the GaN bulk crystal grown in the −C-axis direction can have an increased area, a plurality of GaN self-supported substrates having a large diameter of 4 and 6 inches can be sliced from the GaN bulk crystal.

The nitride semiconductor crystal manufactured according to the present invention can be used as a template substrate, which integrates together an initial substrate made of sapphire or the like and the nitride semiconductor crystal. Alternatively, since the nitride semiconductor crystal relating to the present exemplary embodiment can achieve a greater thickness, the nitride semiconductor crystal may be separated from the initial substrate and put on sale on its own.

The manufacturing method relating to the present invention can grow at high rates a nitride semiconductor crystal having high quality and a large diameter. This makes it possible to manufacture at low costs nitride semiconductor crystals for high-quality and high-efficiency light emitting elements, power devices and the like. In particular, it is highly significant that the increased diameter and the lowered costs enable the nitride semiconductor crystals to be used for power devices, for which the nitride semiconductor crystal have never been used.

FIG. 14 shows how to determine the polarity of a GaN crystal layer using KOH etching. FIG. 14 shows scanning electron micro cope (SEM) photographs showing GaN crystal layers grown using the HVPE technique on a sapphire substrate (the left view) and a GaN template (the right view). In each view, the upper and lower SEM photographs respectively show how the crystal surfaces look before and after subjected to etching using a KOH solution.

The Ga-face is resistant to the KOH etching. On the other hand, the N-face is easily etched by the KOH solution and becomes uneven if etched. Using these characteristics, Ga-face polarity and N-face polarity can be easily distinguished from each other by performing KOH etching on the surface of the grown GaN crystal.

Figure 15:
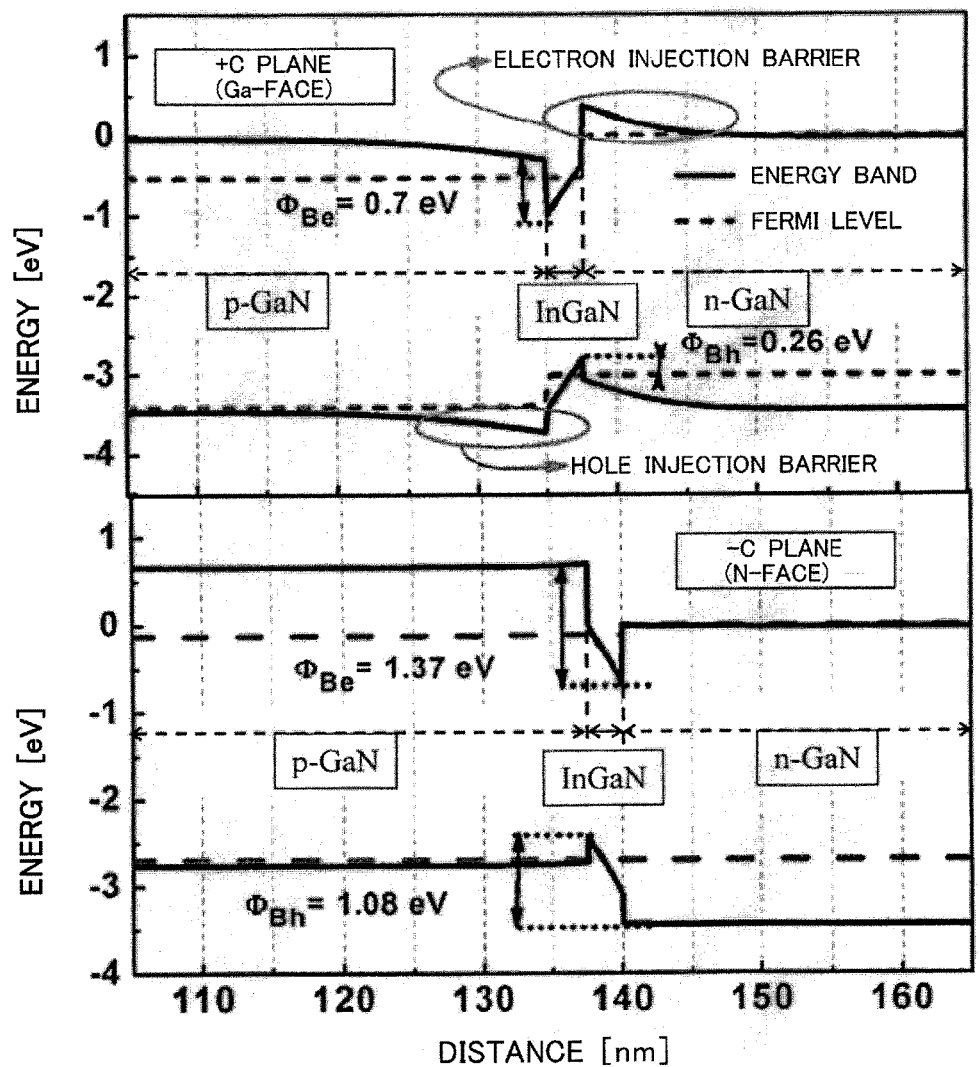
FIG. 15 compares, as an example, the bands of LEDs formed on the –C plane and the +C plane.

FIG. 15 compares, as an example, the bands of LEDs formed on the −C plane and the +C plane, which are computed by numerical simulations. FIG. 15 shows the bands of the crystal layers grown on the +C plane (the upper view) and the −C plane (the lower view). The vertical axis represents the energy [eV] and the horizontal axis represents the distance [nm] from the crystal surface. In the present example, n-GaN, InGaN and p-GaN are grown in the stated order in such a manner that the n-GaN is the closest to the initial substrate. Here, InGaN has a larger lattice constant and a smaller band gap than GaN.

When the crystal layers are grown on the +C plane, the InGaN layer, which is formed on the n-GaN layer, is exposed to compressive strain. Thus, piezoelectric polarization takes place within the crystal, and strong piezoelectric polarization fields are resultantly generated and extend in the direction from the front surface of the InGaN layer towards the surface of the InGaN layer closer to the substrate. Therefore, at the respective edges of the InGaN, the energy level of the n-GaN becomes higher relatively and the energy level of the p-GaN becomes lower relatively. In the above-described manner, when the crystal layers are grown in the +C-axis direction, the barriers are low, which causes the electrons flowing from the n-GaN side to overflow and be flown away without contributing to the light emission.

When the crystal layers are grown on the −C plane, the InGaN layer, which is formed on the n-GaN layer, is exposed to compressive strain. Thus, piezoelectric polarization takes place within the crystal and strong piezoelectric polarization fields are resultantly generated and extend in the direction from the surface of the InGaN layer closer to the substrate towards the front surface of the InGaN layer. Therefore, at the respective edges of the InGaN, the energy level of the n-GaN becomes lower relatively and the energy level of the p-GaN becomes higher relatively. In the above-described manner, when the crystal layers are grown in the −C-axis direction, the barriers are high at the respective edges of the InGaN.

The high barriers at the respective edges of the InGaN confine the electrons and holes in the well and allow them to be recombined easily. For this reason, the LED formed using the −C plane can emit light more efficiently than the GaN crystal layer using the +C plane.

@ By increasing the In ratio in the InGaN crystal layer, the LED can achieve a longer wavelength. Stated differently, it is necessary to provide $In_xGa_{1-x}N$ having a high In ratio $X_{In}$ in order to realize an LED having a longer wavelength.@ However, it is not easy to introduce the In atoms at a high concentration into the GaN crystal layer.

Figure 16:
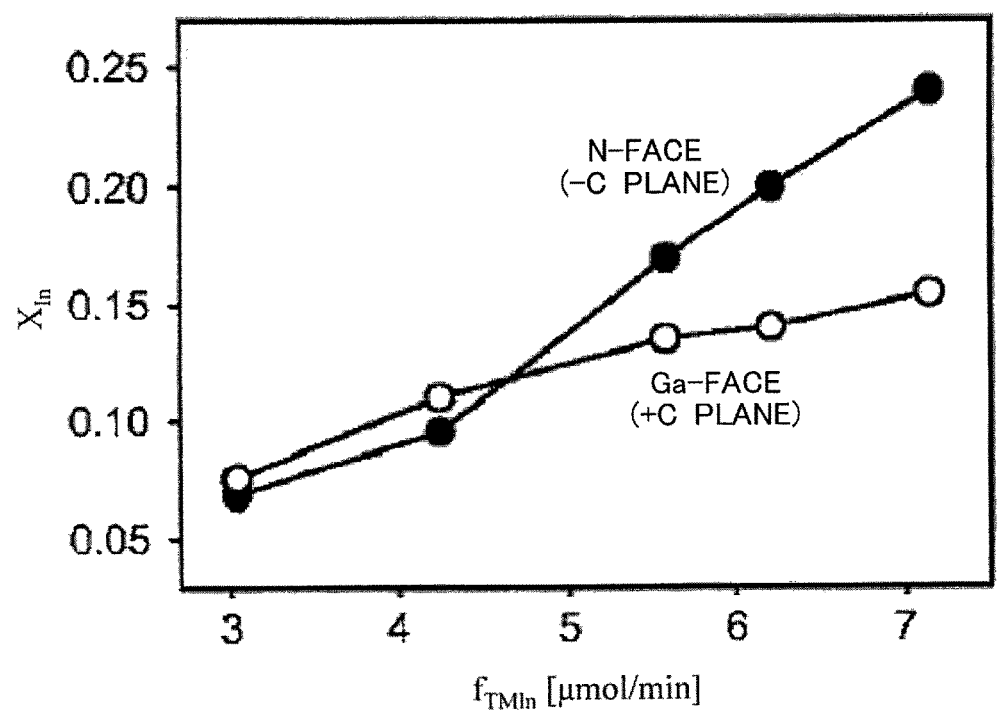
FIG. 16 compares, as an example, how many In atoms are introduced into the –C plane and the +C plane.

FIG. 16 compares, as an example, @how many In atoms are introduced into the −C plane and the +C plane@. FIG. 16 shows the relation between the flow rate $f_{TMIn}$ [µmol/min] of the trimethylindium (TMIn) (represented by the horizontal axis) and the In ratio $X_{In}$ on the GaN surface (represented by the vertical axis). The black and white circles in the graph represent the results of the experiments where InGaN is grown on the N-face and the Ga-face.

In the present example, when the trimethylindium flow rate $f_{TMIn}$ is 5 mol/min or less, there is no difference in In ratio $X_{In}$ between the N-face and the Ga-face. However, once the trimethylindium flow rate $f_{TMIn}$ exceeds 5 mol/min, a higher In ratio $X_{In}$ is achieved when In is introduced into the N-face than when In is introduced into the Ga-face. Accordingly, the GaN crystal layer grown on the −C plane can contribute to realize long-wavelength LEDs.

First Working Example

In a first working example, the nitride semiconductor crystal manufacturing equipment 200 was used to grow a GaN crystal layer with such conditions that the partial pressure of the $GaCl_3$ gas was $1.0 \times 10^{-2}$ atm, the growth temperature is 1200° C. and the growth duration was 12 minutes. The metallic gallium 212 placed in the first reaction chamber 210 was 7N metallic gallium (the purity is 99.99999%). In the present example, the nitride semiconductor substrate 101 was a −C-plane GaN (000̄1) substrate.

A nitrogen ($N_2$) carrier gas and a highly pure $Cl_2$ gas were fed into the first zone Z1. The partial pressure of the $Cl_2$ gas was controlled to be $5 \times 10^{-3}$ atm with respect to the total flow rate in the reaction tube 200 system by regulating the feeds of the $N_2$ carrier gas and the $Cl_2$ gas. Here, "the total flow rate in the reaction tube 200 system" means the total flow rate of the gases flowing through the crystal growing unit G1. The reaction tube temperature in the first zone Z1 was controlled to be 800° C. Here, the reaction tube temperature in the first zone Z1 is equivalent to the temperature at which the source gas reacts in the first zone Z1. Here, the flow rate of the $Cl_2$ gas can be calculated as the product of the total flow rate of the gases flowing through the crystal growing unit G1 and the partial pressure of the $Cl_2$ gas.

A $N_2$ carrier gas and a highly pure $Cl_2$ gas are fed into the second zone Z2. The partial pressure of the $Cl_2$ gas is controlled to be $1 \times 10^{-2}$ atm with respect to the total flow rate within the reaction tube 200 system by regulating the feeds of the $N_2$ carrier gas and the $Cl_2$ gas. The reaction tube temperature in the second zone Z2 is controlled to be 800° C. The reaction tube temperature in the second zone Z2 is equivalent to the temperature at which the source gases react with each other in the second zone Z2.

A $N_2$ carrier gas and a $NH_3$ gas are fed into the growth chamber 230. In the growth chamber 230, the discharge rate and the feeds of the $N_2$ carrier gas and the $NH_3$ gas are adjusted. In the growth chamber 230, the partial pressure of the $NH_3$ gas is $8 \times 10^{-2}$ atm and the partial pressure of the $GaCl_3$ gas is $1.0 \times 10^{-2}$ atm.

While the temperature of the substrate is being raised, the growth chamber 230 has a gas mixture atmosphere including the $N_2$ carrier gas and the $NH_3$ gas. The partial pressure of the $NH_3$ gas as fed is $8 \times 10^{-2}$ atm with respect to the total flow rate of the gases flowing into the growth chamber 230. After the substrate temperature reaches a predetermined growth temperature, the $GaCl_3$ gas, which is generated in the first reaction chamber 210, is immediately fed into the growth chamber 230 to start growing the GaN crystal layer. After the growth of the GaN crystal layer is completed, the $GaCl_3$ gas is stopped and the temperature of the substrate is lowered to room temperature within the gas mixture atmosphere of the $N_2$ carrier gas and the $NH_3$ gas. While the temperature of the substrate is being lowered, the partial pressure of the $NH_3$ gas as fed is kept $8 \times 10^{-2}$ atm with respect to the total flow rate of the gases flowing into the growth chamber 230.

Figure 17:
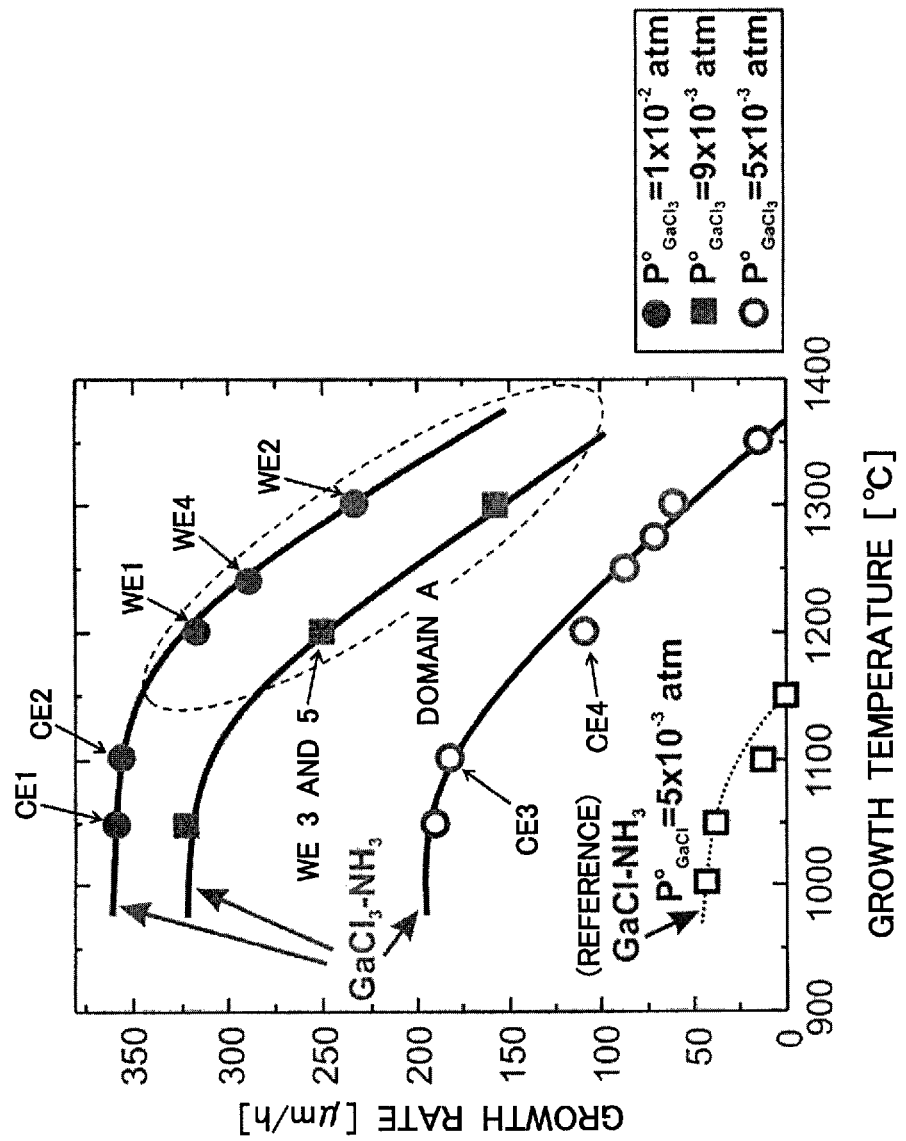
FIG. 17 shows the relation between the partial pressure of a $GaCl_3$ gas and the growth rate of a GaN crystal.

FIG. 17 shows the relation between the partial pressure of the $GaCl_3$ gas and the growth rate of the GaN crystal layer. FIG. 17 shows the relation between the growth temperature [° C.] and the growth rate [µm/h] observed while the GaN crystal is grown. In FIG. 17, the letters "CE" denotes a comparative example, the letters "WE" denotes a working example, and the numbers attached correspond to the numbers of the comparative and working examples. When the nitride semiconductor crystal manufacturing equipment 250 is used, the partial pressure of the $GaCl_3$ gas cannot exceed $8.0 \times 10^{-3}$ atm. The nitride semiconductor crystal manufacturing equipment 200, however, can achieve a partial pressure of $9.0 \times 10^{-3}$ atm or higher for the $GaCl_3$ gas. For example, when the partial pressure of the $GaCl_3$ gas is $1 \times 10^{-2}$ am, the growth rate is approximately doubled in the high-temperature domain in which the growth temperature is 1200° C. or higher, when compared with the case where the partial pressure of the $GaCl_3$ gas is controlled to be $5 \times 10^{-3}$ atm The applicant has found that the use of the THVPE technique in a domain A can achieve stable growth of a high-quality GaN crystal layer including few defects and impurities in the −C-axis direction. Here, the domain A denotes a domain in which the growth rate linearly drops as the growth temperature rises.

Figure 18:
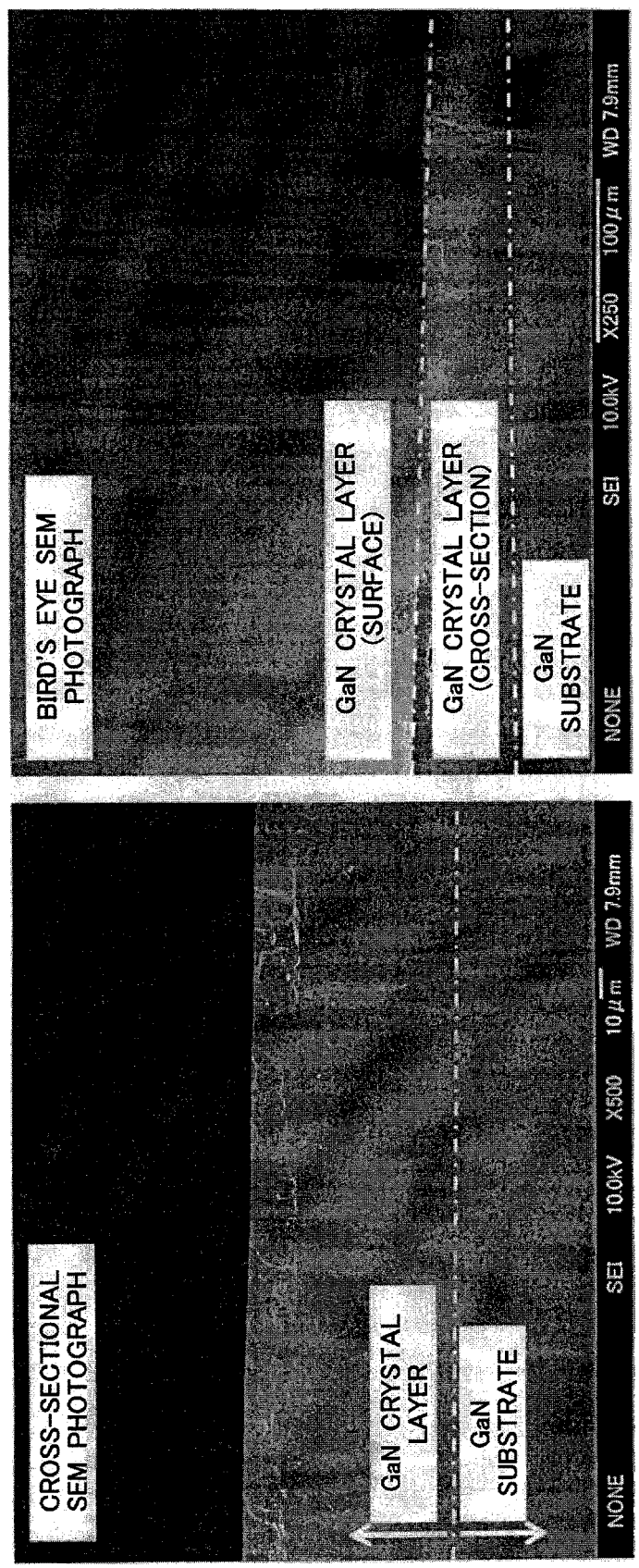
FIG. 18 shows cross-sectional and bird's-eye SEM photographs of a GaN crystal layer relating to a first working example.

FIG. 18 shows cross-sectional and bird's-eye SEM photographs of the GaN crystal layer relating to the first working example. The GaN crystal layer of the present working example had a mirror-like surface appearance and no pits or protrusions were observed. Since the partial pressure of the $GaCl_3$ gas is set at a high level of $1.0\times10^{-2}$ atm, the growth rate rises, but the growth temperature can be still set at a high level of 1200° C. As a result, the GaN crystal layer is uniformly grown. The GaN crystal of the present working example has a highly flat front surface. Referring to the crystallinity of the GaN crystal layer of the first working example, the X-ray diffraction half-value width (Tilt) of the GaN(0002) plane was 570 arcsec. Here, a small X-ray diffraction half-value width value means high crystallinity of the GaN crystal layer.

Second Working Example

In a second working example, a GaN crystal layer was grown with the growth temperature of 1300° C. Except for the growth temperature, the other conditions were the same as in the first working example. The growth rate of the second working example is lower than the growth rate of the first working example. Referring to the crystallinity of the GaN crystal layer of the second working example, however, the X-ray diffraction half-value width of the GaN(0002) plane was 374 arcsec. Thus, the second working example can further improve the crystallinity of the GaN crystal layer by raising the growth temperature, when compared with the first working example.

Third Working Example

In a third working example, a GaN crystal layer was grown with the partial pressure of the $GaCl_3$ gas being set to $9.0\times10^{-3}$ atm. Except for the partial pressure of the $GaCl_3$ gas, the other conditions are basically the same as in the first working example with some exceptions. The following describes the difference between the third working example and the first working example.

In the third working example, the partial pressure of the $Cl_2$ gas fed into the first zone Z1 in the first process is $4.5\times10^{-3}$ atm with respect to the total flow rate within the reaction tube 200 system. Furthermore, the partial pressure of the $Cl_2$ gas fed into the second zone Z2 in the second process is $9\times10^{-3}$ atm with respect to the total flow rate within the reaction tube 200 system. As shown in FIG. 17, the third working example successfully achieved a high growth rate of approximately 250 μm/h. The crystallinity achieved by the third working example was similar to the crystallinity achieved by the first working example.

Fourth Working Example

In a fourth working example, a GaN crystal layer was grown on a sapphire (0001) substrate with the growth temperature being set to 1250° C. and the growth duration being set to 15 minutes. Except for the growth temperature and the initial substrate, the other conditions are basically the same as in the first working example with some exceptions. The following describes the differences between the fourth working example and the first working example.

While the temperature of the substrate was being raised, the atmosphere within the growth chamber 230 only contained the $N_2$ carrier gas. The total flow rate of the $N_2$ carrier gas is 3500 sccm while the temperature of the substrate is being raised. Once the substrate temperature reaches a predetermined growth temperature, the $NH_3$ gas and the generated $GaCl_3$ gas are immediately fed into the growth chamber 230 to grow a GaN crystal.

After the growth of the GaN crystal layer is completed, the $GaCl_3$ gas is stopped and the temperature of the substrate was lowered to room temperature within the gas mixture atmosphere of the $N_2$ carrier gas and the $NH_3$ gas. Here, the partial pressure of the $NH_3$ gas as fed is controlled to be $8\times10^{-2}$ atm with respect to the total flow rate of the gases flowing into the growth chamber 230.

FIG. 19 shows optical micrographs showing the GaN crystal layer relating to the fourth working example. FIG. 19 shows the cross-sections of the GaN crystal layer and the sapphire substrate magnified 500 and 1000 times. On the edge surface of the GaN crystal layer relating to the present example, the (10¯11) facet plane, which forms an angle of approximately 60 degrees with the growing surface, was present. In other words, the crystal size of the GaN crystal layer increases as the GaN crystal layer grows.

Figure 20:
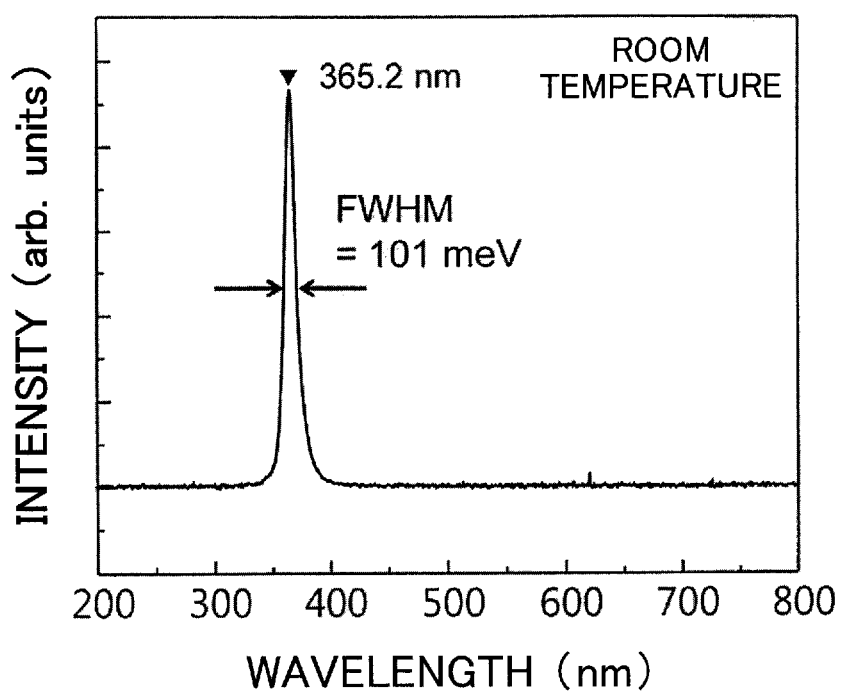
FIG. 20 shows the photoluminescence (PL) spectrum of a GaN crystal layer.

FIG. 20 shows the photoluminescence (PL) spectrum of the GaN crystal layer relating to the fourth working example. In the present example, the PL spectrum was measured at room temperatures using He—Cd laser having a wavelength of 325 nm. In the PL spectrum, near band edge emission is clearly present at the wavelength of 365 nm and no emission is caused by defects or impurities within the long wavelength range (400 to 800 nm). This means that impurities are hardly introduced into the GaN crystal layer relating to the fourth working example.

Fifth Working Example

In a fifth working example, a GaN crystal layer was grown with the growth duration being set to 30 minutes. Except for the growth duration, the other conditions are the same as in the third working example.

Figure 21:
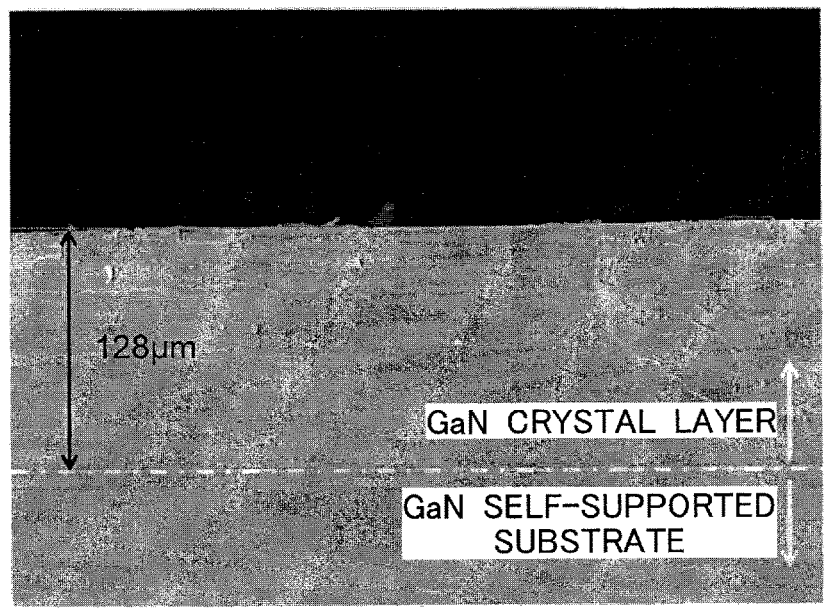
FIG. 21 shows a cross-sectional SEM photograph of a GaN crystal layer relating to a fifth working example.

FIG. 21 shows a cross-sectional SEM photograph of the GaN crystal layer relating to the fifth working example. In the present example, the GaN crystal layer has a thickness of 128 μm. Despite having a large thickness of 100 μm or more, the GaN crystal layer still maintains the evenness on its front surface and the front surface of the GaN crystal layer is highly flat. Thus, the use of the GaN crystal layer growing method of the present example enables a thick GaN crystal layer to grow.

First Comparative Example

In a first comparative example, a GaN crystal layer was grown with the growth temperature being set to 1050° C. Except for the growth temperature, the other conditions are the same as in the first working example.

Figure 22:
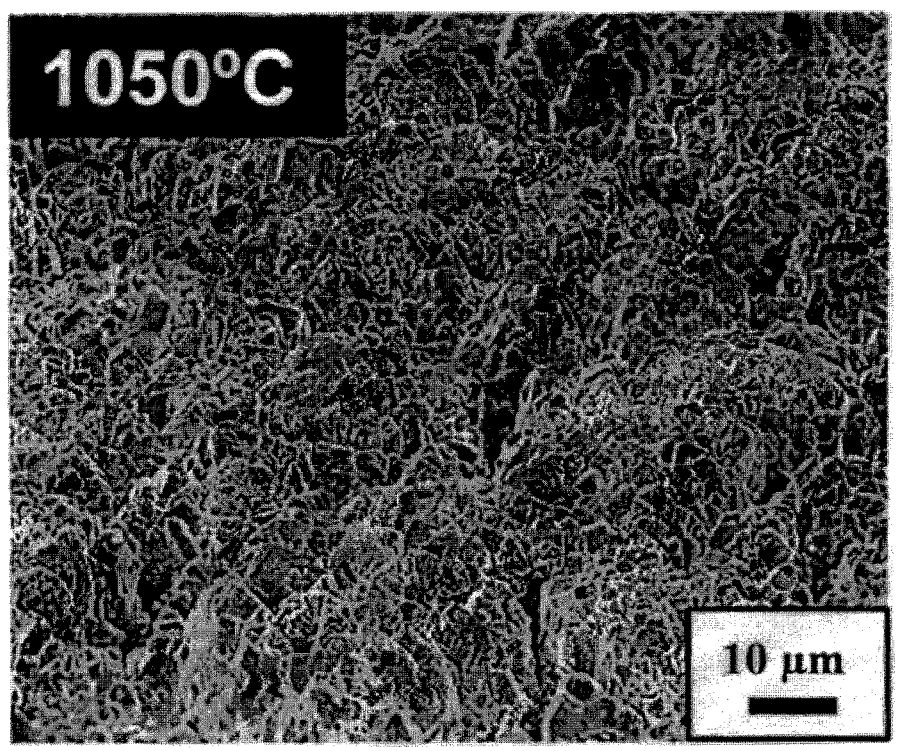
FIG. 22 shows a bird's-eye SEM photograph of a GaN crystal layer relating to a first comparative example.

FIG. 22 shows a bird's-eye SEM photograph of the GaN crystal layer relating to the first comparative example. The GaN crystal layer of the present example suffers from poorer migration of the source materials at its front surface and has a rougher surface morphology, when compared with the GaN crystal layer of the first working example. In the first comparative example, the X-ray diffraction half-value width of the GaN (0002) plane was 3214 arcsec.

Second Comparative Example

In a second comparative example, a GaN crystal layer was grown with the growth temperature being set to 1100° C.

Except for the growth temperature, the conditions are the same as in the first working example.

Figure 23:
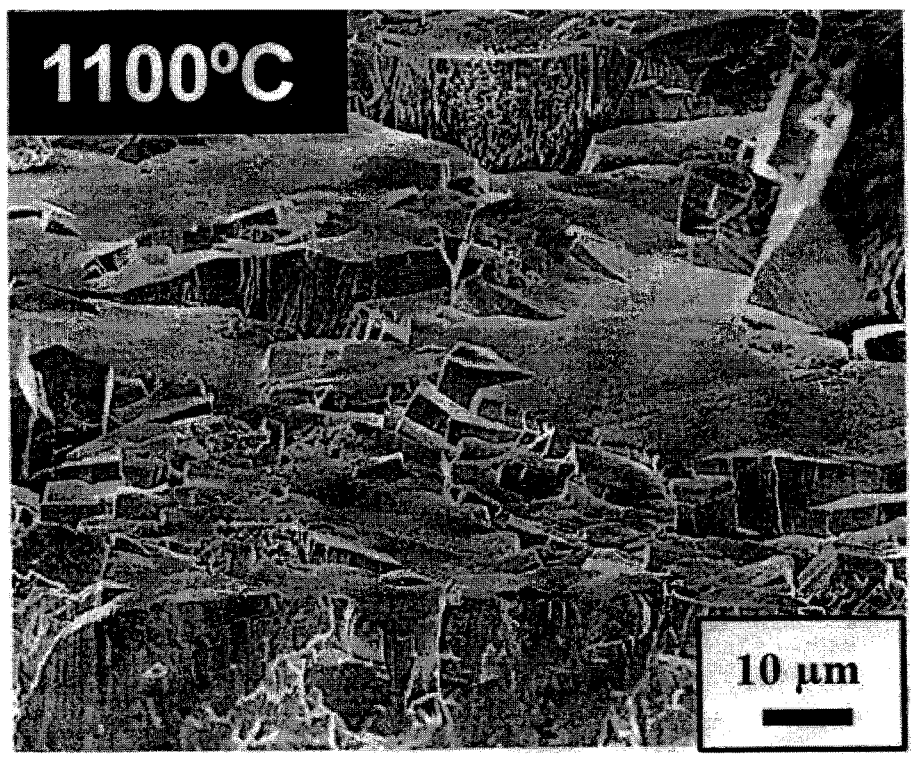
FIG. 23 shows a bird's-eye SEM photograph of a GaN crystal layer relating to a second comparative example.

FIG. 23 shows a bird's-eye SEM photograph of the GaN crystal layer relating to the second comparative example. The GaN crystal layer of the present example has better flatness than the GaN crystal layer of the first comparative example but has a rougher surface morphology than the GaN crystal layer of the first working example. In the second comparative example, the X-ray diffraction half-value width of the GaN (0002) plane was 1854 arcsec.

Third Comparative Example

In a third comparative example, a GaN crystal layer was grown using the nitride semiconductor crystal manufacturing equipment 200 under such conditions that the partial pressure of the $GaCl_3$ gas was $5 \times 10^{-3}$ atm, the growth temperature was 1100° C., and the growth duration was 20 minutes. The metallic gallium 212 situated in the first reaction chamber 210 was 7N-grade (the purity of 99.99999%) metallic gallium. In the present example, the nitride semiconductor substrate 101 was a −C-plane GaN (000⁻1) substrate.

A $N_2$ carrier gas and a highly pure $Cl_2$ gas are fed into the first zone Z1. The partial pressure of the $Cl_2$ gas is controlled to be $2.5 \times 10^{-3}$ atm with respect to the total flow rate within the reaction tube 200 system, by regulating the feeds of the $N_2$ carrier gas and the $Cl_2$ gas. The reaction tube temperature in the first zone Z1 is adjusted to be equal to 800° C.

A $N_2$ carrier gas and a highly pure $Cl_2$ gas are fed into the second zone Z2. The partial pressure of the $Cl_2$ gas is controlled to be $5 \times 10^{-3}$ atm with respect to the total flow rate within the reaction tube 200 system, by regulating the feeds of the $N_2$ carrier gas and the $Cl_2$ gas. The reaction tube temperature in the second zone Z2 is adjusted to be equal to 800° C.

A $N_2$ carrier gas and a $NH_3$ gas are fed into the growth chamber 230. In the growth chamber 230, the discharge rate and the feeds of the $N_2$ carrier gas and the $NH_3$ gas are adjusted. In the growth chamber 230, the partial pressure of the $NH_3$ gas is $8 \times 10^{-2}$ atm and the partial pressure of the $GaCl_3$ gas is $5 \times 10^{-3}$ atm.

While the temperature of the substrate is being raised, the growth chamber 230 has a gas mixture atmosphere including the $N_2$ carrier gas and the $NH_3$ gas. The partial pressure of the $NH_3$ gas as fed is $1 \times 10^{-1}$ atm with respect to the total flow rate of the gases flowing into the growth chamber 230. After the substrate temperature reaches a predetermined growth temperature, the $GaCl_3$ gas, which is generated in the first reaction chamber 210, is immediately fed into the growth chamber 230 to start growing the GaN crystal layer. After the growth of the GaN crystal layer is completed, the $GaCl_3$ gas is stopped and the temperature of the substrate is lowered to room temperature within the gas mixture atmosphere of the $N_2$ carrier gas and the $NH_3$ gas. While the temperature of the substrate is being lowered, the partial pressure of the $NH_3$ gas as fed is kept $8 \times 10^{-1}$ atm with respect to the total flow rate of the gases flowing into the growth chamber 230.

Figure 24:
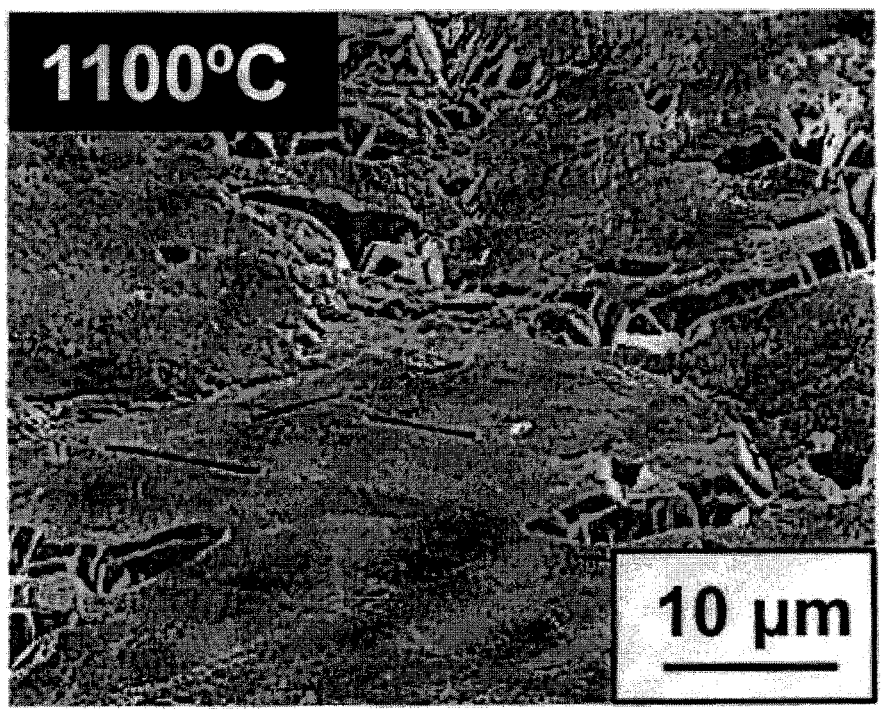
FIG. 24 shows a bird's-eye SEM photograph of a GaN crystal layer relating to a third comparative example.

FIG. 24 shows a bird's-eye SEM photograph of the GaN crystal layer relating to the third comparative example. The GaN crystal layer of the present example has a rough surface and poorly flat. In the third comparative example, the X-ray diffraction half-value width of the GaN (0002) plane was 852 arcsec. As described above, the GaN crystal layer relating to the third comparative example is a less flat front surface and exhibits a low growth rate than the GaN crystal layer of the first working example.

Fourth Comparative Example

In a fourth comparative example, a GaN crystal layer was grown with the growth temperature being set to 1200° C. Except for the growth temperature, the other conditions are the same as in the third comparative example. The fourth comparative example achieves a growth rate of approximately 100 μm/h, which is lower than the growth rate achieved by the third comparative example.

Figure 25:
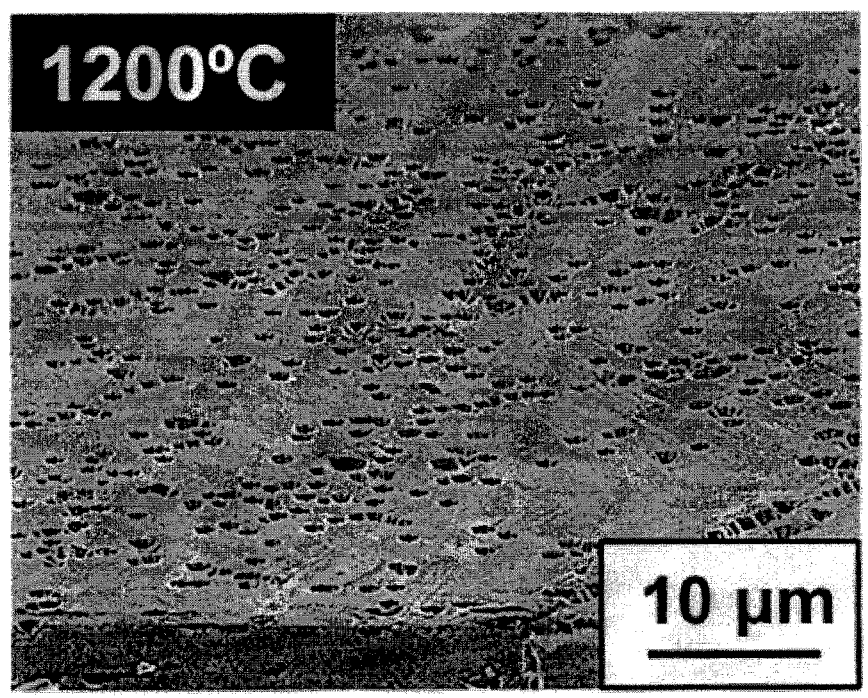
FIG. 25 shows a bird's-eye SEM photograph of a GaN crystal layer relating to a fourth comparative example.

FIG. 25 shows a bird's-eye SEM photograph of the GaN crystal layer relating to the fourth comparative example. The front surface of the GaN crystal layer of the present example is rough but flatter than the front surface of the GaN crystal layer of the third comparative example shown in FIG. 24. Nevertheless, the GaN crystal layer of the fourth comparative example has a less flat front surface and exhibits a lower growth rate than the GaN crystal layers of the first and second working examples.

Figure 26:
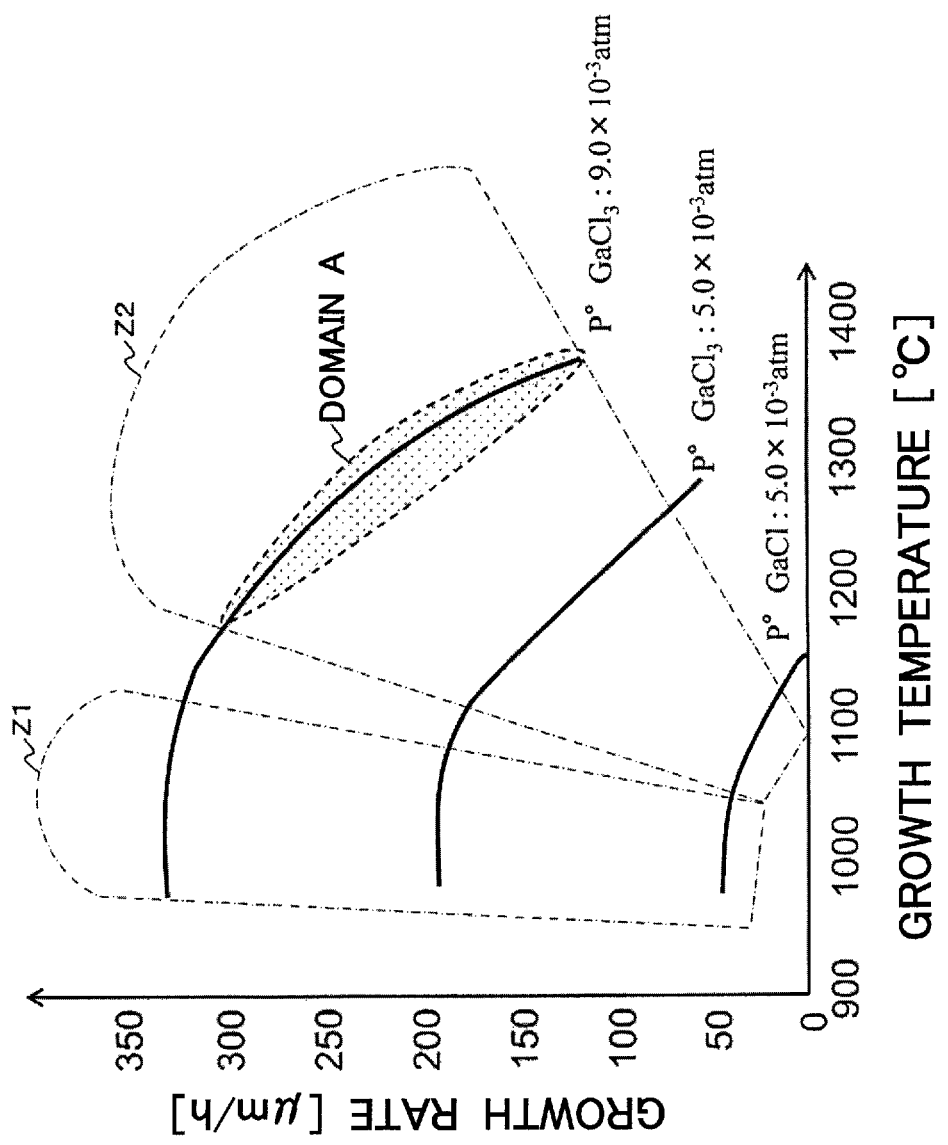
FIG. 26 shows the relation between the growth temperature and the growth rate observed when a nitride semiconductor crystal is grown.

FIG. 26 illustrates how to determine the conditions under which a nitride semiconductor crystal is grown. The horizontal axis represents the growth temperature [° C.] and the vertical axis represents the growth rate [μm/h]. The solid lines show the relation between the growth temperature and the growth rate observed when various types of gases are fed to the substrate with the partial pressure being set to various levels.

Generally speaking, it is required to optimize the growth temperature and the growth rate in order to grow nitride semiconductor crystals of excellent crystallinity at high rates. The conventional THVPE technique has not yet achieved a sufficiently high growth rate for nitride semiconductor crystals. There are thus a need to further increase the growth rate. Here, it should be noted that, as shown in FIG. 9, the growth rate drops as the growth temperature of the substrate rises. Considering this, it has been typically done in the related art to grow a nitride semiconductor crystal in a low-temperature region (the zone Z1), not in a high-temperature region (the zone Z2). Here, the growth rate starts to drop in the high-temperature region and a higher growth rate is achieved in the low-temperature region than in the high-temperature region.

Since the conventional method of growing a nitride semiconductor crystal never achieved a sufficiently high crystal growth rate, it could not have been appreciated that the zone Z2 might be used in which the growth rate drops. The conventional method also has such a disadvantage that the crystallinity may degrade if the growth rate for the nitride semiconductor crystal is simply increased. The conventional THVPE technique had a trade-off. Specifically, while a raised growth temperature results in a decreased growth rate, a lowered growth temperature prevents a crystal from being stably grown in the −C-axis direction and increases the impurity concentration.

The applicant has succeeded in growing nitride semiconductor crystals using the zone Z2, which has never been used, through controlling the partial pressure of a gallium trihalide gas. To be specific, the applicant has successfully grown a nitride semiconductor crystal having excellent crystallinity at high rates by controlling the partial pressure of a gallium trihalide gas to be $9.0 \times 10^{-3}$ atm or higher and using the zone Z2. For example, since the growth temperature is higher in the zone Z2 than in the zone Z1, the source gases are activated and more easily transported to the locations at which the source gases are stabilized on the crystal growth surface. When the growth temperature is low, the source gases are crystallized before sufficiently moved on the crystal growth surface. This is why the crystallinity is low. Furthermore, the crystal can be stably grown in the −C-axis direction in the domain of high growth temperatures. This stabilizes the growth surface and resultantly achieves the improved crystallinity for the nitride semiconductor crystals.

As described above, a nitride semiconductor crystal having excellent crystallinity can be grown if the partial pressure of the gallium trihalide gas is controlled to be $9.0 \times 10^{-3}$ atm or higher and the domain A is used where the growth temperature is 1200° C. or higher. Additionally, the domain A, in which high growth rates are achieved, can be selected by controlling the growth temperature. In this manner, the THVPE technique relating to the present example has succeeded in eliminating the trade-off of the conventional THVPE technique.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

DESCRIPTION OF REFERENCE NUMERALS

100 . . . laminate, 101 . . . initial substrate, 200 . . . nitride semiconductor crystal manufacturing equipment, 210 . . . first reaction chamber, 212 . . . metallic gallium, 214 . . . preventing structure, 220 . . . second reaction chamber, 222 . . . partition, 230 . . . growth chamber, 232 . . . susceptor, 234 . . . initial substrate, 236 . . . ammonia gas inlet, 238 . . . second outlet, 250 . . . nitride semiconductor crystal manufacturing equipment, 260 . . . common reaction chamber, 262 . . . first halogen gas inlet, 264 . . . second halogen gas inlet, 266 . . . first outlet, 300 laminate, 301 . . . initial substrate, 302 . . . low-temperature buffer layer, 303 . . . nitride semiconductor thin film layer, 304 . . . defect

What is claimed is:

1. A manufacturing method for a nitride semiconductor crystal, comprising:
    providing a substrate;
    heating the substrate to a growth temperature;
    feeding a gallium trihalide gas having a partial pressure of $9.0 \times 10^{-3}$ atm or higher onto the substrate; and
    growing a GaN crystal in the −C-axis direction on the substrate after the substrate temperature reaches the growth temperature, wherein
    the growth temperature for the GaN crystal is 1200° C. or higher.

2. The manufacturing method for a nitride semiconductor crystal as set forth in claim 1, further comprising:
    generating a gallium monohalide gas by causing metallic gallium and a halogen gas to react with each other; and
    generating the gallium trihalide gas by causing the generated gallium monohalide gas and a halogen gas to react with each other, wherein
    a preventing structure between a first reaction chamber in which the generation of the gallium monohalide gas takes place and a second reaction chamber in which the generation of the gallium trihalide gas takes place prevents a drop in a concentration of the gallium monohalide gas generated in the first reaction chamber.

3. The manufacturing method for a nitride semiconductor crystal as set forth in claim 2, wherein
    the preventing structure is a path between the first reaction chamber and the second reaction chamber, and
    a cross-sectional area of the path is smaller than a cross-sectional area of the first reaction chamber and a cross-sectional area of the second reaction chamber.

4. The manufacturing method for a nitride semiconductor crystal as set forth in claim 2, wherein
    the second reaction chamber has a plurality of partitions designed to slow down a flow velocity of the gallium trihalide gas.

5. The manufacturing method for a nitride semiconductor crystal as set forth in claim 2, wherein
    the partial pressure of the halogen gas fed into the first reaction chamber is $9.0 \times 10^{-3}$ atm or higher.

6. The manufacturing method for a nitride semiconductor crystal as set forth in claim 1, wherein
    the substrate is made of a different material than the nitride semiconductor crystal.

7. The manufacturing method for a nitride semiconductor crystal as set forth in claim 1, further comprising
    after the growing of the GaN crystal in the −C-axis direction, repeatedly performing (i) slicing off a top portion of the nitride semiconductor crystal and (ii) further growing the crystal on the sliced-off top portion of the nitride semiconductor crystal.

8. The manufacturing method for a nitride semiconductor crystal as set forth in claim 1, wherein the gallium trihalide gas is a gallium trichloride gas.

9. The manufacturing method for a nitride semiconductor crystal as set forth in claim 1, wherein
    the growing of the GaN crystal in the −C-axis direction employs trihalide vapor phase epitaxy (THVPE).

10. The manufacturing method for a nitride semiconductor crystal as set forth in claim 1, wherein
    a growth rate for the GaN crystal is 250 μm/h or higher.

* * * * *